US012563747B2

(12) United States Patent
Sung et al.

(10) Patent No.: US 12,563,747 B2
(45) Date of Patent: Feb. 24, 2026

(54) THREE DIMENSIONAL ReRAM DEVICE

(71) Applicant: INTERNATIONAL BUSINESS MACHINES CORPORATION, Armonk, NY (US)

(72) Inventors: Min Gyu Sung, Latham, NY (US); Soon-Cheon Seo, Glenmont, NY (US); Heng Wu, Santa Clara, CA (US); Julien Frougier, Albany, NY (US); Chen Zhang, Guilderland, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 537 days.

(21) Appl. No.: 18/059,672

(22) Filed: Nov. 29, 2022

(65) Prior Publication Data

US 2024/0179924 A1 May 30, 2024

(51) Int. Cl.
H10B 63/00 (2023.01)
H10N 70/00 (2023.01)

(52) U.S. Cl.
CPC ......... H10B 63/845 (2023.02); H10N 70/063 (2023.02)

(58) Field of Classification Search
CPC .. H10N 70/826; H10N 70/063; H10N 70/823; H10B 63/845
See application file for complete search history.

(56) References Cited

U.S. PATENT DOCUMENTS 8,923,050 B2    12/2014    Cernea et al.
9,054,307 B2     6/2015    Wang et al.

9,466,794 B2    10/2016    Yang et al.
9,595,566 B2     3/2017    Takaki
9,761,800 B2     9/2017    Phatak
11,088,203 B2    8/2021    Hsieh
11,196,000 B2   12/2021    Kim et al.
2013/0094273 A1   4/2013    Chien et al.
2017/0053906 A1   2/2017    Or-Bach et al.
2017/0154845 A1   6/2017    Takaki (Continued)

FOREIGN PATENT DOCUMENTS

CN         114284295  A       4/2022
JP           5369071  B2      12/2013

(Continued)

OTHER PUBLICATIONS

Chen et al., "HfOx Based Vertical Resistive Random Access Memory for Cost-Effective 3D Cross-Point Architecture without Cell Selector," IEEE Xplore, 2012, pp. 20.7.1-20.7.4.

(Continued)

*Primary Examiner* — Mounir S Amer

(74) *Attorney, Agent, or Firm* — Jeffrey M. Ingalls

(57) ABSTRACT

A resistive random access memory (ReRAM) device and a method for forming the device are provided. The ReRAM device includes a first electrode, a resistive switching element layer in contact with the first electrode, and a plurality of second electrodes in contact with the resistive switching element layer. Protruding portions of the first electrode and the resistive switching element layer overlap with the plurality of second electrodes in a vertical direction of the ReRAM device to form a plurality of vertically stacked ReRAM cells.

9 Claims, 34 Drawing Sheets

(56) References Cited

U.S. PATENT DOCUMENTS

| | | | |
|---|---|---|---|
| 2018/0158947 A1* | 6/2018 | Yeh | H10N 70/8833 |
| 2020/0144496 A1 | 5/2020 | Glassman | |
| 2021/0167128 A1 | 6/2021 | Ando et al. | |
| 2021/0242239 A1 | 8/2021 | Lin | |
| 2021/0313512 A1* | 10/2021 | Cai | H10B 63/20 |
| 2022/0051698 A1 | 2/2022 | Han | |
| 2024/0147877 A1* | 5/2024 | Lung | H10N 70/841 |

FOREIGN PATENT DOCUMENTS

| | | |
|---|---|---|
| JP | 2018-198321 A | 12/2018 |
| KR | 2019-0110504 A | 9/2019 |
| WO | 2014194069 A2 | 12/2014 |

OTHER PUBLICATIONS

Deng et al., "Design and Optimization Methodology for 3D RRAM Arrays," IEEE Xplore, 2013, pp. 25.7.1-25.7.4.

Lee et al., "2-stack 1D-1R Cross-point Structure with Oxide Diodes as Switch Elements for High Density Resistance RAM Applications," IEEE Xplore, 2007, pp. 771-774.

Sung et al., "Development of 1T-1R cross bar test vehicle for RRAM technology on 300mm wafers," Sematech, 2008, 20 pages.

Tseng et al., "Solving the Scaling Issue of Increasing Forming Voltage in Resistive Random Access Memory Using High-k Spacer Structure," Advanced Electronic Materials, Sep. 2017, 8 pages.

Ye et al., "Ultimate vertical gate-all-around metal-oxide-semiconductor field-effect transistor and its three-dimensional integrated circuits," Materials Science in Semiconductor Processing, Jul. 1, 2021, 10 pages, vol. 134.

* cited by examiner

100

THREE DIMENSIONAL ReRAM DEVICE

BACKGROUND

The present disclosure generally relates to fabrication methods and resulting structures for semiconductor based electronic devices. More specifically, the present disclosure relates to a three-dimensional resistive random access memory (ReRAM) having a low forming voltage.

ReRAM structures can be used as a type of non-volatile (NV) random-access memory (RAM) in computing resources. ReRAM devices having a simple metal-insulator-metal structure show promising characteristics in terms of scalability, low power operation, and multilevel data storage capability, and they may be suitable for next-generation memory applications. ReRAM typically operates by controlled changes in resistance across a dielectric solid-state material. The dielectric solid-state material may be referred to as a memristor. ReRAM may be considered as a promising technology for electronic synapse devices (or memristors) for neuromorphic computing as well as high-density and high-speed non-volatile memory applications. In neuromorphic computing applications, a resistive memory device can be used as a connection (synapse) between a pre-neuron and post-neuron, representing the connection weight in the form of device resistance. Multiple pre-neurons and post-neurons can be connected through a cross-bar array of ReRAMs, which may enable a fully-connected neural network. Oxygen vacancies in a metal oxide layer of a ReRAM device are the building blocks of a current conducting filament.

Conventional filamentary switching ReRAM devices require a forming step to create a soft breakdown. As the switching area of the ReRAM device scales down, the forming voltages generally increase. Therefore, an external device for providing the high forming voltage may be required, which may result in increased power consumption during the forming step. If the ReRAM switching area is increased in attempt to reduce the forming voltage, there is an area penalty, which reduces the special density of the ReRAM devices.

SUMMARY

Embodiments of the present disclosure relate to a resistive random access memory (ReRAM) device. The ReRAM device includes a first electrode, a resistive switching element layer in contact with the first electrode, and a plurality of second electrodes in contact with the resistive switching element layer. Protruding portions of the first electrode and the resistive switching element layer overlap with the plurality of second electrodes in a vertical direction of the ReRAM device to form a plurality of vertically stacked ReRAM cells. An effect of these features is that a larger memory cell area can be achieved without a penalty in the footprint of the overall device. Another effect of increasing the cell area is that the forming voltage for the filaments of the ReRAM cells may be reduced without the penalty in the footprint.

In certain embodiments of the ReRAM device, the plurality of ReRAM cells have a stepped configuration. In these embodiments, the stepped configuration allows a three-dimensional stacking of the ReRAM cells to allow for greater device density in a given area.

In certain embodiments of the ReRAM device, for each ReRAM cell, a portion of the second electrode that is not overlapped with the first electrode in the vertical direction is sandwiched between dielectric layers. This allows for the vertical stacking of the ReRAM cells, which allows for greater device density in a given area.

In certain embodiments of the ReRAM device, the dielectric layers have a higher etching selectivity relative to the second electrodes. This allows for recessed areas to be formed in the dielectric layer, which further allows for an increased surface area of the second electrodes to be in contact with the resistive switching layer. This in turn allows for a larger memory cell area without a penalty in the footprint of the overall device.

In certain embodiments of the ReRAM device, the dielectric layers are recessed in a lateral direction relative to the second electrodes. This allows for an increased surface area of the second electrodes to be in contact with the resistive switching layer. This in turn allows for a larger memory cell area without a penalty in the footprint of the overall device.

In certain embodiments of the ReRAM device, the resistive switching layer includes a high-κ material. This allows for ReRAM memory cells to be formed.

In certain embodiments of the ReRAM device, a shared bit line is provided that is in contact with the first electrode. This allows for each memory cell in the ReRAM device to be connected to a common bit line contact.

In certain embodiments of the ReRAM device, the device further includes a plurality of word lines, each word line being connected to one of the plurality of second electrodes. This allows for the vertical stacking of the ReRAM cells, which allows for greater device density in a given area.

In certain embodiments of the ReRAM device, the device further includes an interlayer dielectric layer separating a first group of the ReRAM cells from a second group of the ReRAM cells and dividing the first electrode into a first ReRAM cell group electrode and a second ReRAM cell group electrode. This allows for one bit line to function with the first group of the ReRAM cells and another bit line to function with the second group of the ReRAM cells.

In certain embodiments of the ReRAM device, the device further comprising a first bit line connected to the first ReRAM cell group electrode and a second bit line connected to the second ReRAM cell group electrode. This allows for one bit line to function with the first group of the ReRAM cells and another bit line to function with the second group of the ReRAM cells.

Other embodiments relate to a method of fabricating a resistive random access memory (ReRAM) device. The method includes forming a memory stack including plurality of alternating layers of dielectric layers and first electrodes, forming a trench through the memory stack; performing an isotropic etching process on the dielectric layers so that the dielectric layers are recessed in a lateral direction relative to the first electrodes and to form recessed areas, forming a resistive switching element layer in contact with the first electrode in the recessed areas, and forming a second electrode in the trench and the recessed areas, the second electrode being in contact with the resistive switching element layer. Protruding portions of the second electrode and the resistive switching element layer overlap with the plurality of second electrodes in a vertical direction of the ReRAM device to form a plurality of vertically stacked ReRAM cells. An effect of these features is that a larger memory cell area can be achieved without a penalty in the footprint of the overall device. Another effect of increasing the cell area is that the forming voltage for the filaments of the ReRAM cells may be reduced without the penalty in the footprint.

In certain embodiments of the method of fabricating a ReRAM device, the plurality of ReRAM cells have a stepped configuration. In these embodiments, the stepped configuration allows a three-dimensional stacking of the ReRAM cells to allow for greater device density in a given area.

In certain embodiments of the method of fabricating a ReRAM device, for each ReRAM cell, a portion of the first electrode that is not overlapped with the second electrode in the vertical direction is sandwiched between the dielectric layers. This allows for the vertical stacking of the ReRAM cells, which allows for greater device density in a given area.

In certain embodiments of the method of fabricating a ReRAM device, the dielectric layers have a higher etching selectivity relative to the first electrodes. This allows for recessed areas to be formed in the dielectric layer, which further allows for an increased surface area of the second electrodes to be in contact with the resistive switching layer. This in turn allows for a larger memory cell area without a penalty in the footprint of the overall device.

In certain embodiments of the method of fabricating a ReRAM device, the method further includes performing an anisotropic etching of the resistive switching element to remove exposed horizontal portions thereof. This allows for subsequent connection to one or more metal contacts, such as a bit line.

In certain embodiments of the method of fabricating a ReRAM device, the resistive switching layer includes a high-K material. This allows for ReRAM memory cells to be formed.

In certain embodiments of the method of fabricating a ReRAM device, the method further includes forming a shared bit line that is in contact with the second electrode. This allows for each memory cell in the ReRAM device to be connected to a common bit line contact.

In certain embodiments of the method of fabricating a ReRAM device, the method further includes forming a plurality of word lines, each word line connected to one of the plurality of first electrodes. This allows for the vertical stacking of the ReRAM cells, which allows for greater device density in a given area.

In certain embodiments of the method of fabricating a ReRAM device, the method further includes forming an interlayer dielectric layer separating a first group of the ReRAM cells from a second group of the ReRAM cells and dividing the second electrode into a first ReRAM cell group electrode and a second ReRAM cell group electrode. This allows for one bit line to function with the first group of the ReRAM cells and another bit line to function with the second group of the ReRAM cells.

In certain embodiments of the method of fabricating a ReRAM device, the method further includes forming a first bit line connected to the first ReRAM cell group electrode and forming a second bit line connected to the second ReRAM cell group electrode. This allows for one bit line to function with the first group of the ReRAM cells and another bit line to function with the second group of the ReRAM cells.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

5

6

Figure 6A:
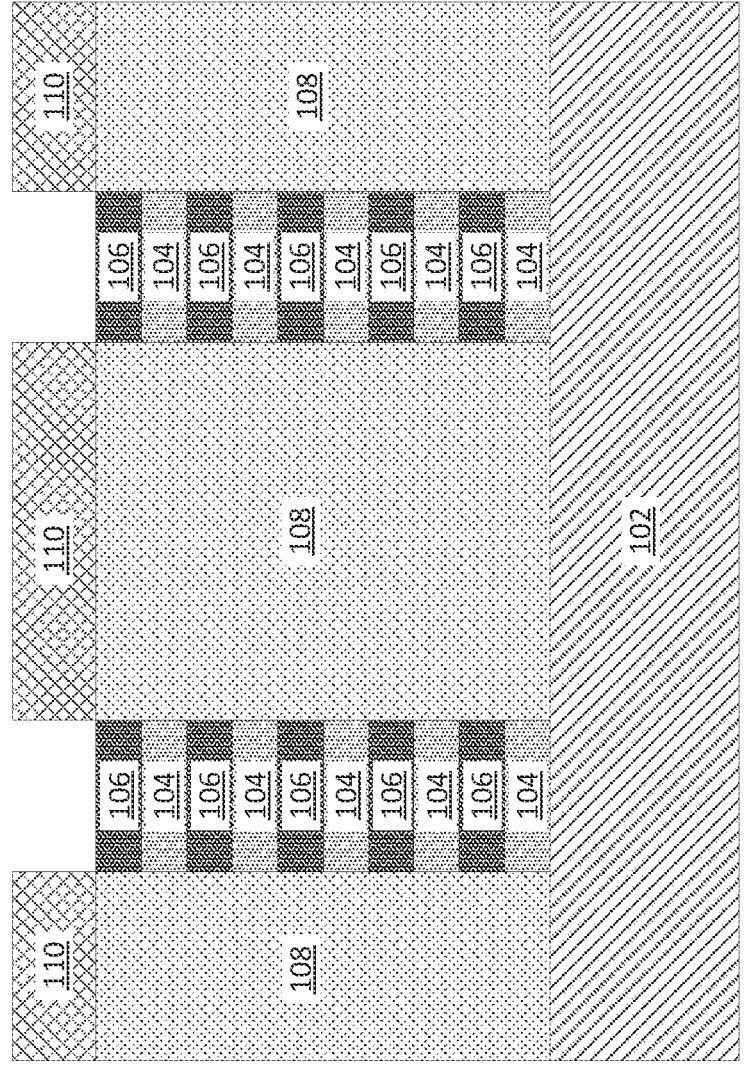
FIG. 6A is a cross-sectional view of the ReRAM device of FIG. 5A at a subsequent stage of the manufacturing process, taken along the line A-A of FIG. 6C, according to embodiments.
Figure 6A:
Figure 6B:
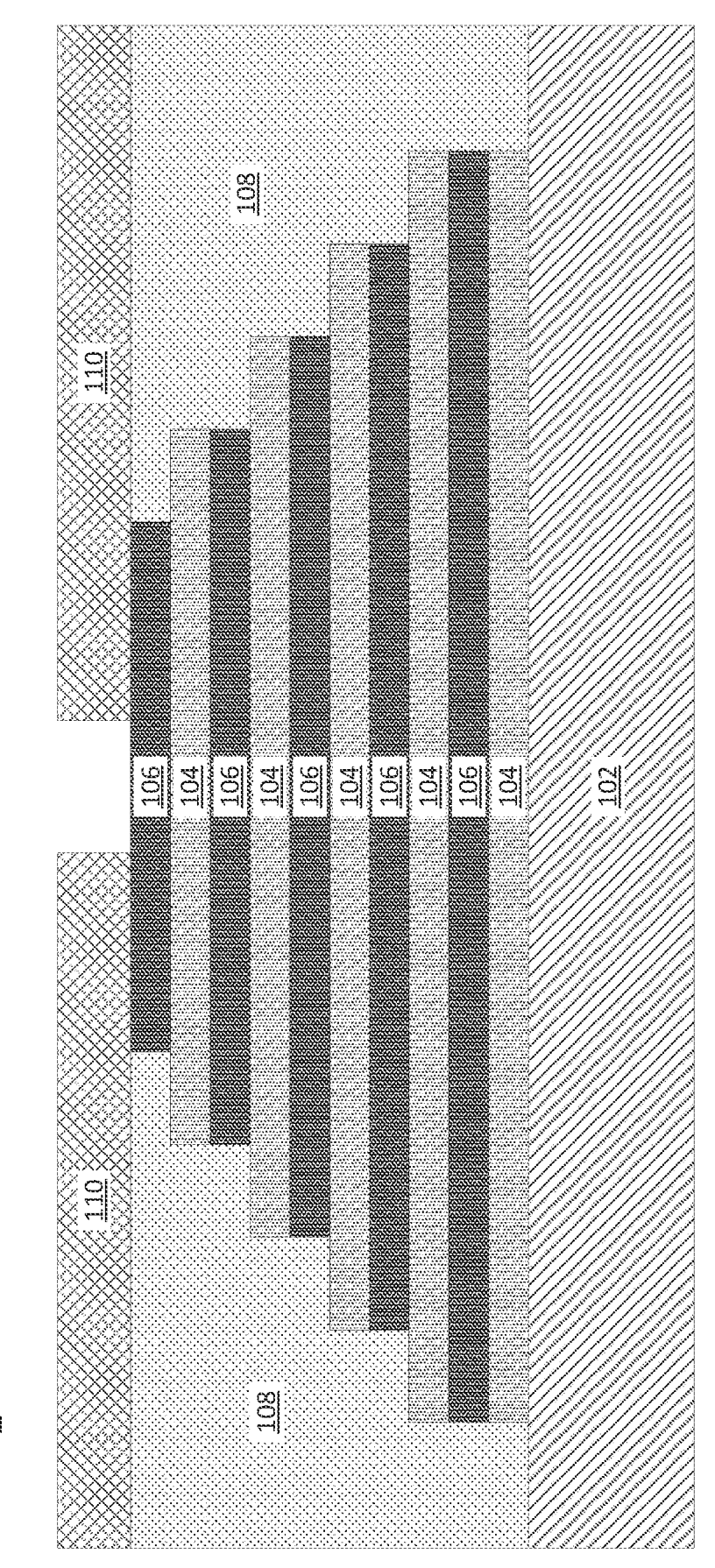
FIG. 6B is a cross-sectional view of the ReRAM device of FIG. 5B at a subsequent stage of the manufacturing process, taken along line B-B of FIG. 6C, according to embodiments.
Figure 6C:
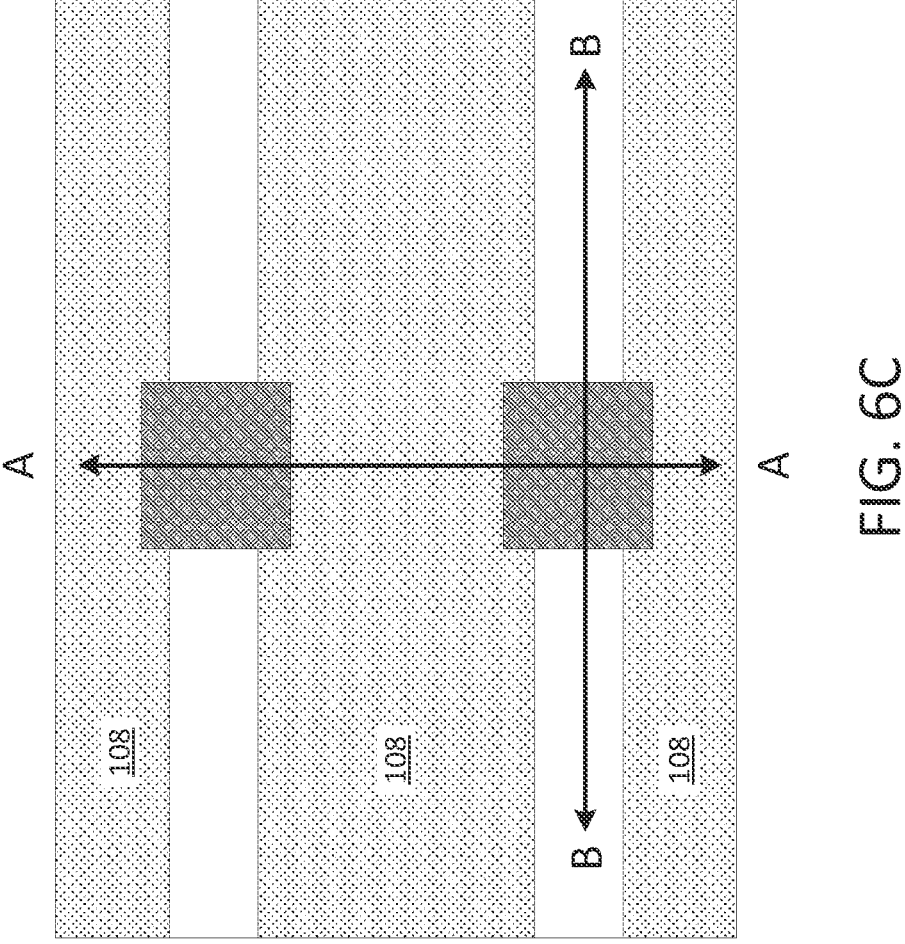
FIG. 6C is a top-down view of the ReRAM device of FIGS. 6A and 6B, according to embodiments.
Figure 6C:
Figure 7A:
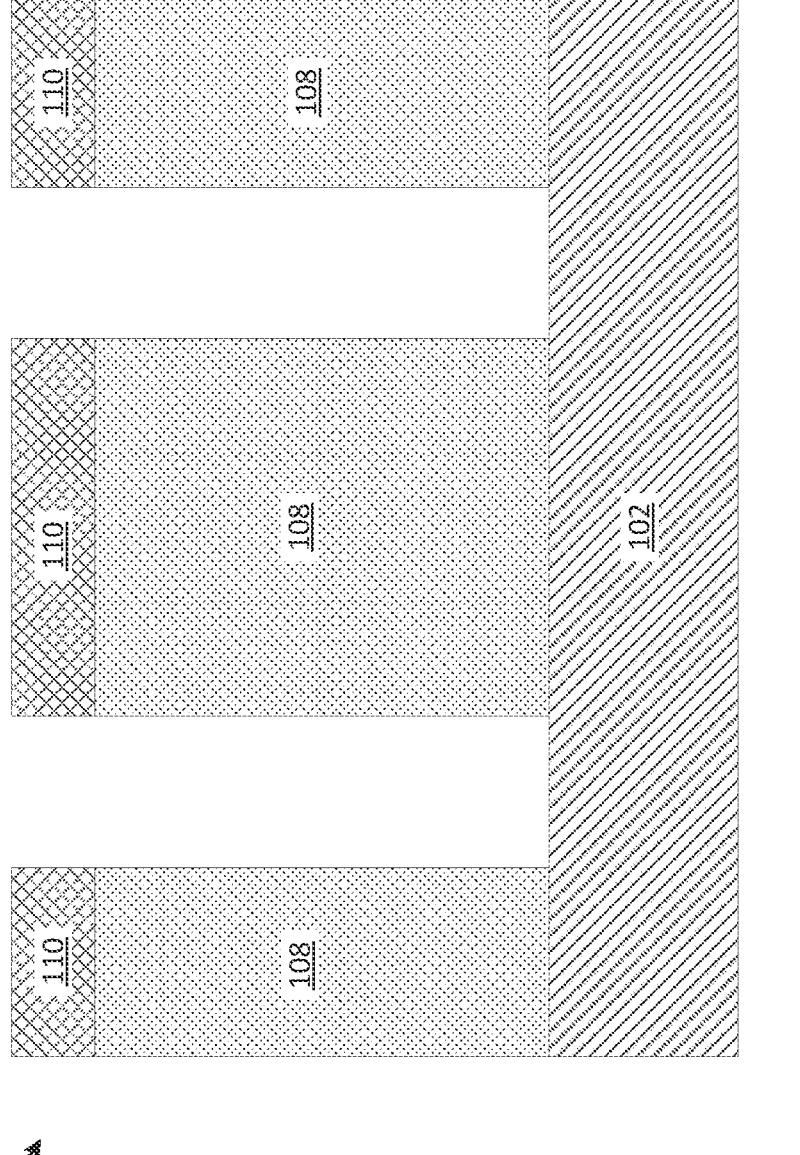
FIG. 7A is a cross-sectional view of the ReRAM device of FIG. 6A at a subsequent stage of the manufacturing process, taken along the line A-A of FIG. 6C, according to embodiments.
Figure 8A:
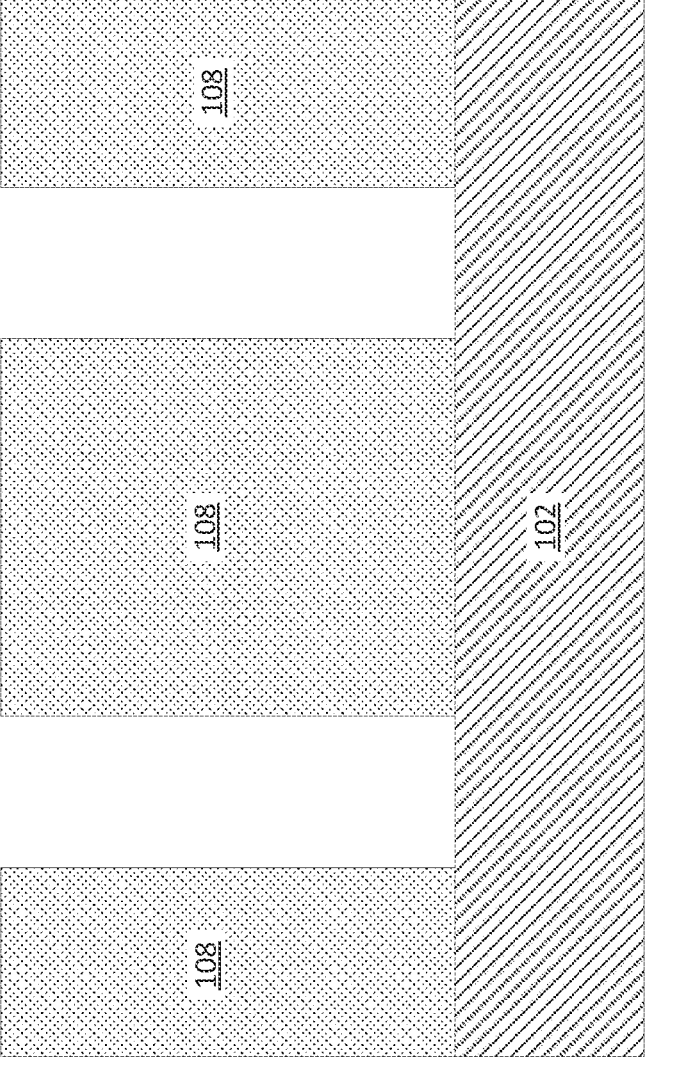
Figure 8A:

FIG. 8A is a cross-sectional view of the ReRAM device of FIG. 7A at a subsequent stage of the manufacturing process, taken along the line A-A of FIG. 6C, according to embodiments.

Figure 7B:
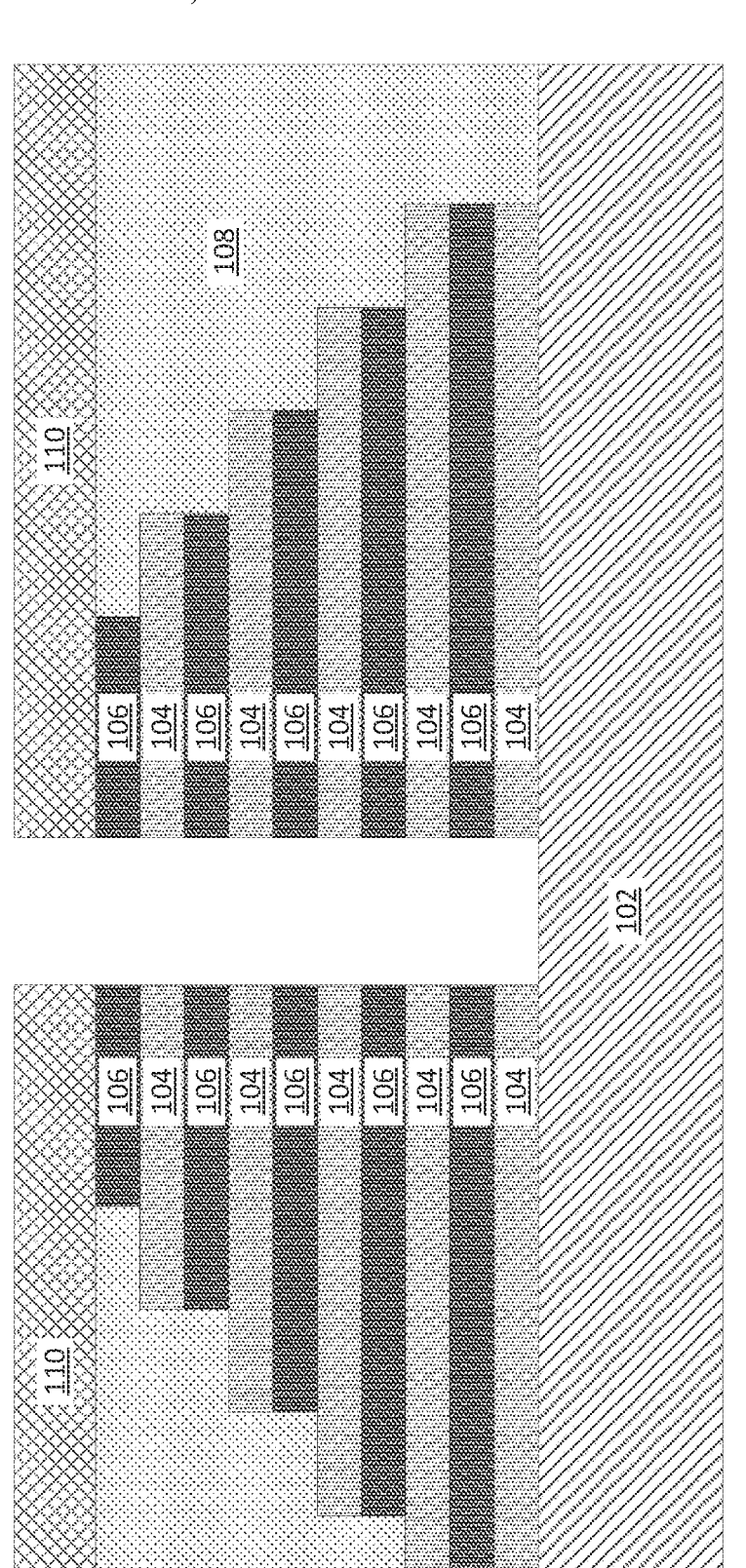
FIG. 7B is a cross-sectional view of the ReRAM device of FIG. 6B at a subsequent stage of the manufacturing process, taken along line B-B of FIG. 6C, according to embodiments.
Figure 8B:
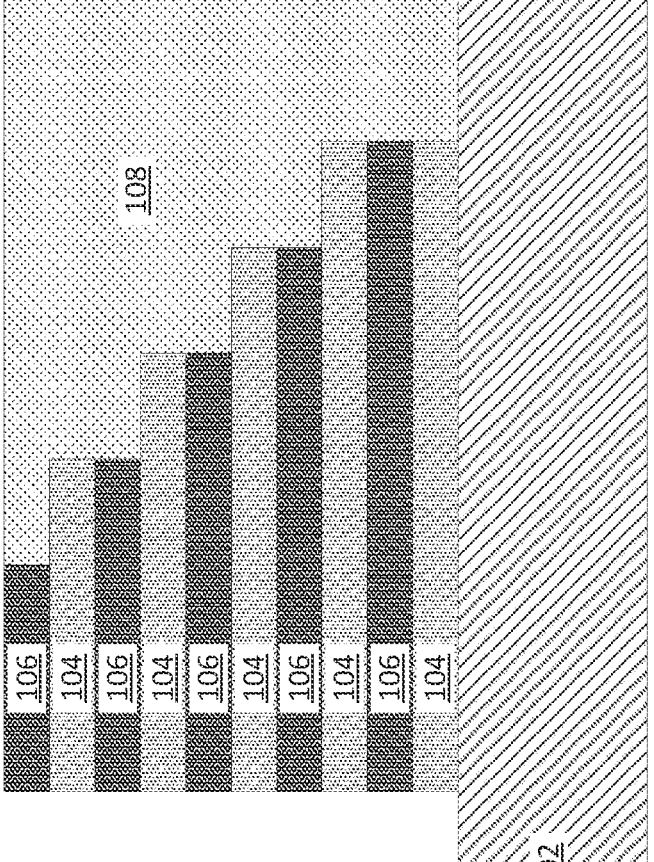

FIG. 8B is a cross-sectional view of the ReRAM device of FIG. 7B at a subsequent stage of the manufacturing process, taken along line B-B of FIG. 6C, according to embodiments.

Figure 9A:
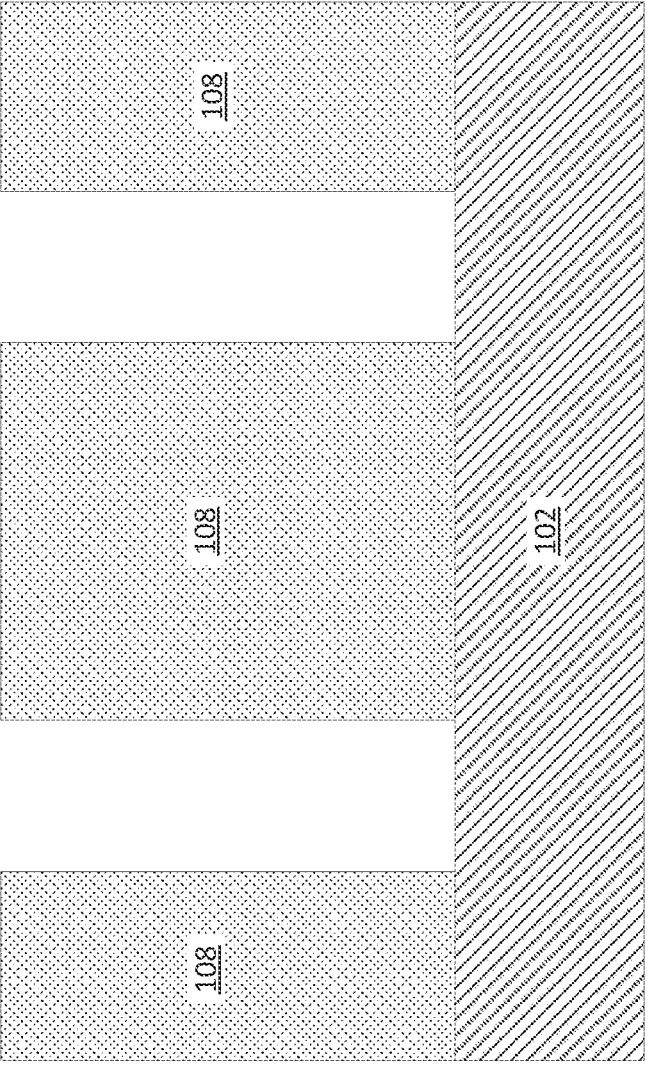
Figure 9A:

FIG. 9A is a cross-sectional view of the ReRAM device of FIG. 8A at a subsequent stage of the manufacturing process, taken along the line A-A of FIG. 6C, according to embodiments.

Figure 9B:
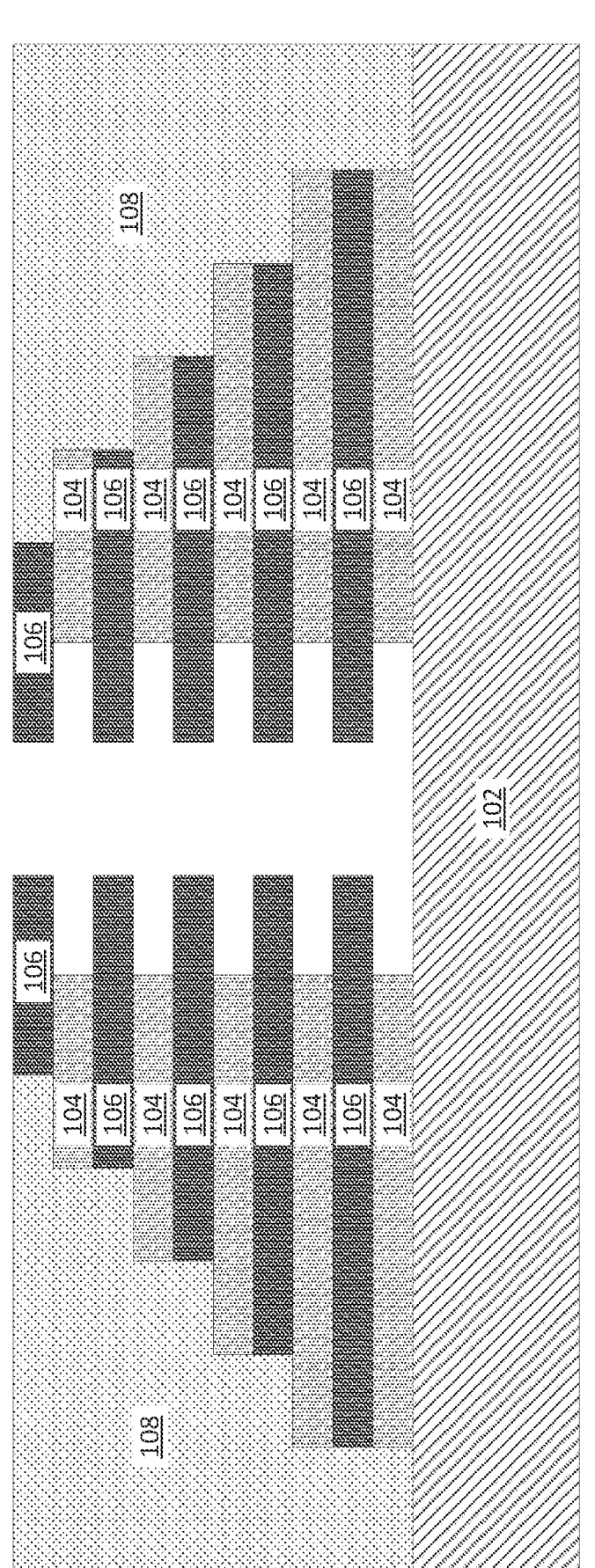

FIG. 9B is a cross-sectional view of the ReRAM device of FIG. 8B at a subsequent stage of the manufacturing process, taken along line B-B of FIG. 6C, according to embodiments.

Figure 10A:
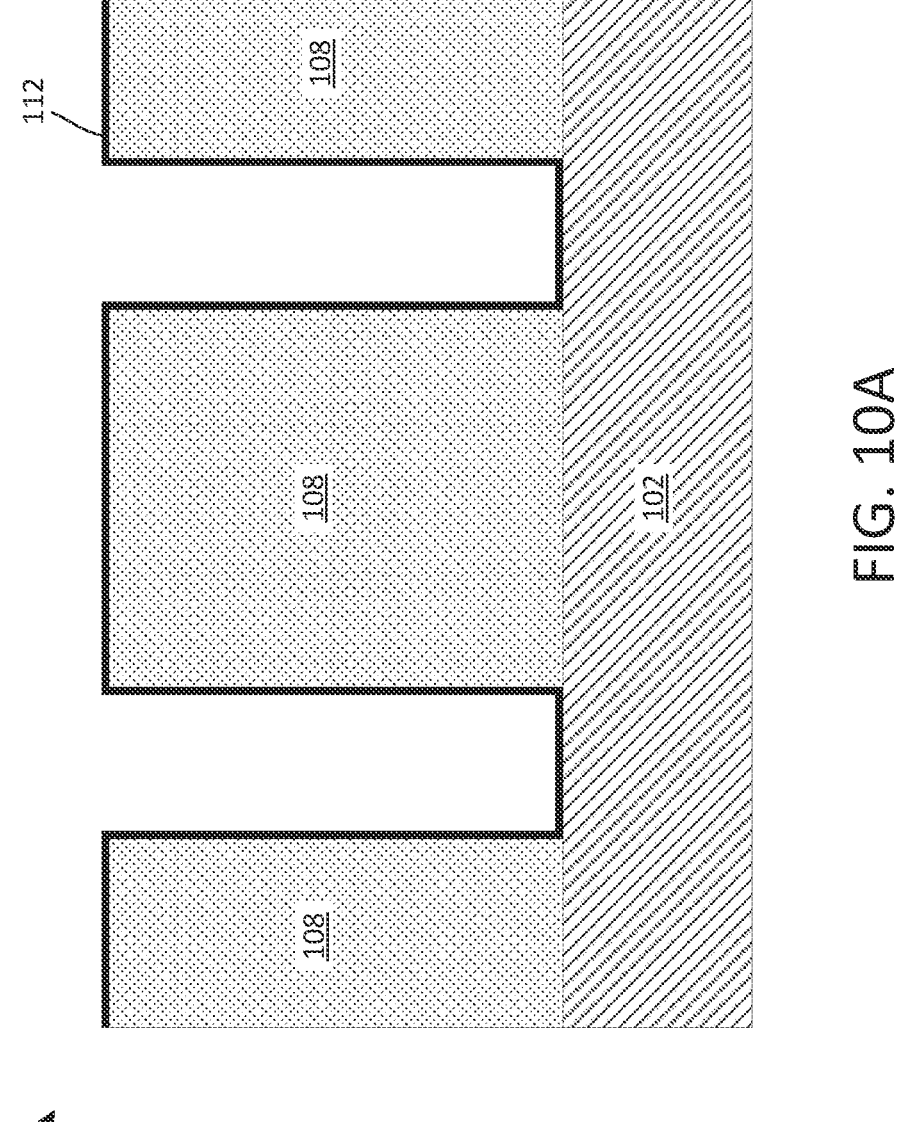

FIG. 10A is a cross-sectional view of the ReRAM device of FIG. 9A at a subsequent stage of the manufacturing process, taken along the line A-A of FIG. 6C, according to embodiments.

Figure 10B:
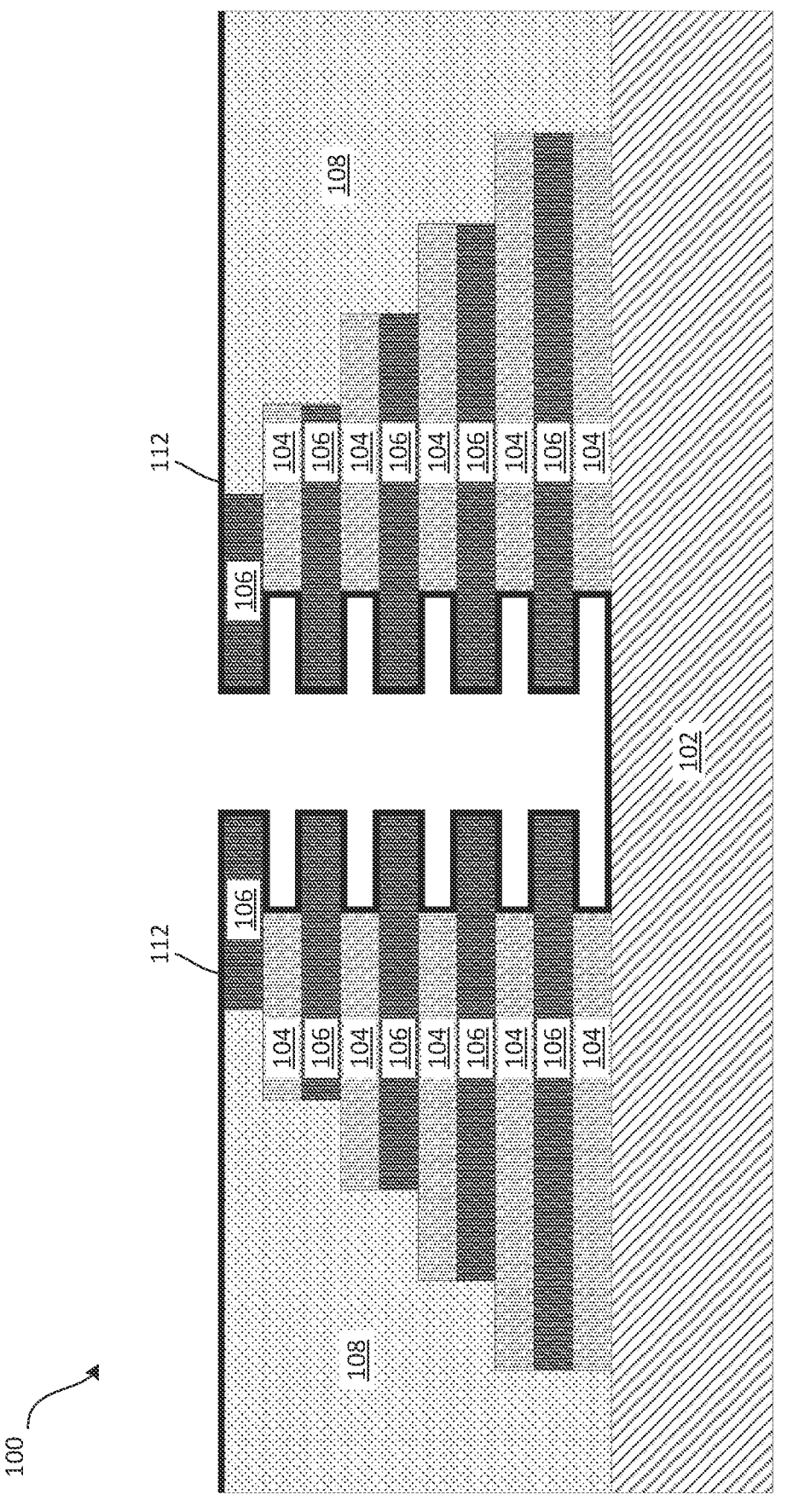

FIG. 10B is a cross-sectional view of the ReRAM device of FIG. 9B at a subsequent stage of the manufacturing process, taken along line B-B of FIG. 6C, according to embodiments.

Figure 11A:
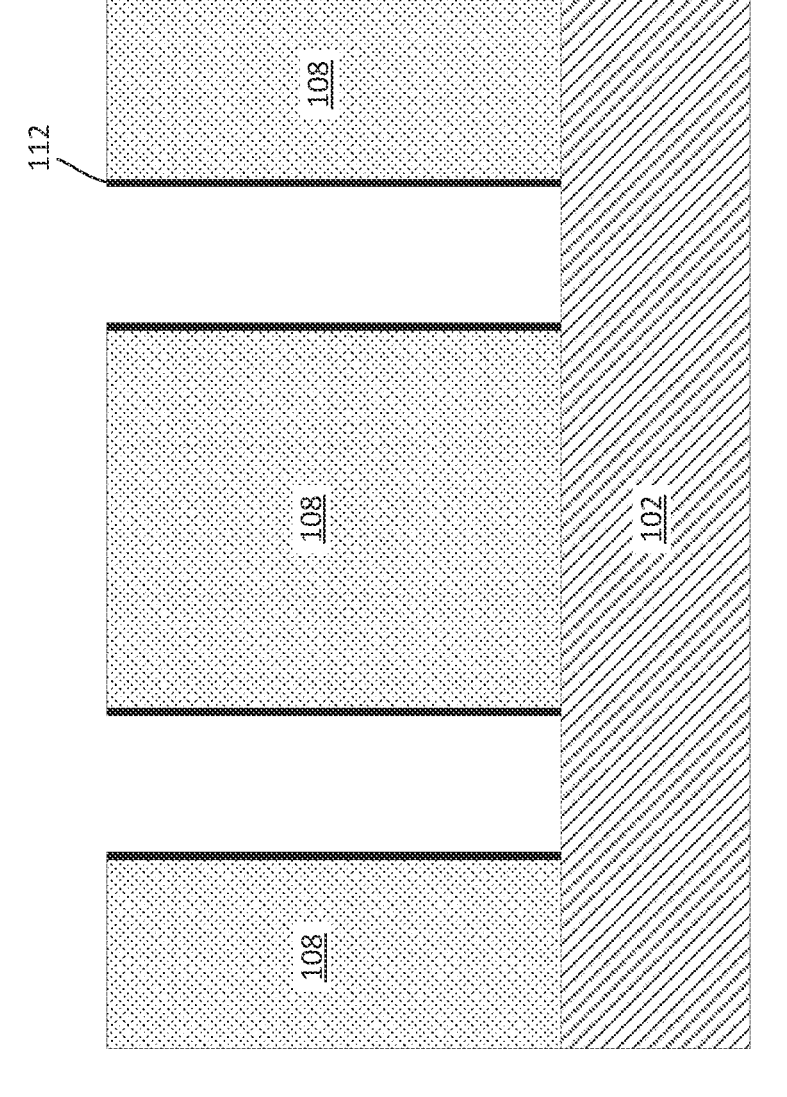

FIG. 11A is a cross-sectional view of the ReRAM device of FIG. 10A at a subsequent stage of the manufacturing process, taken along the line A-A of FIG. 6C, according to embodiments.

Figure 11B:
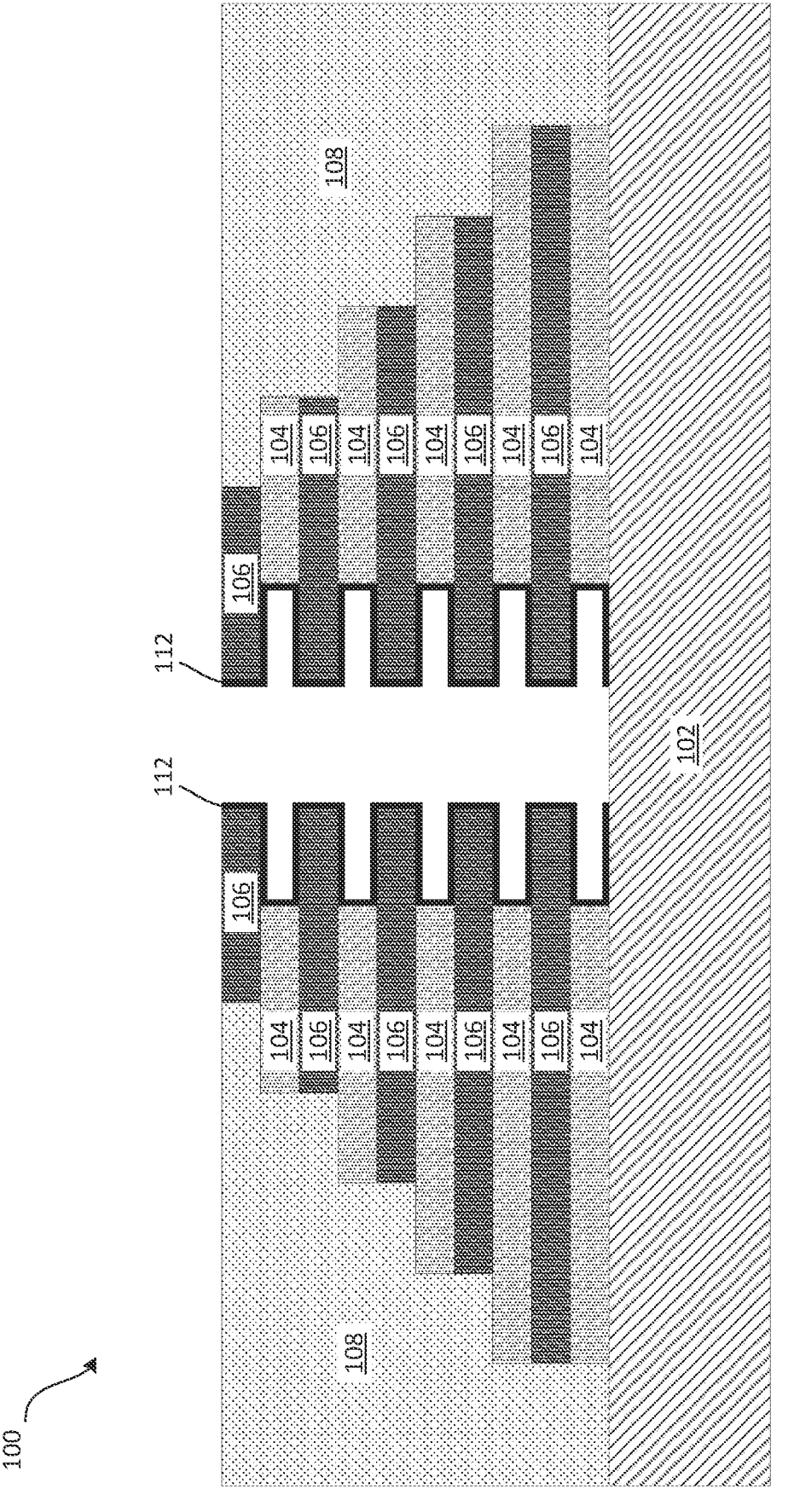

FIG. 11B is a cross-sectional view of the ReRAM device of FIG. 10B at a subsequent stage of the manufacturing process, taken along line B-B of FIG. 6C, according to embodiments.

Figure 12A:
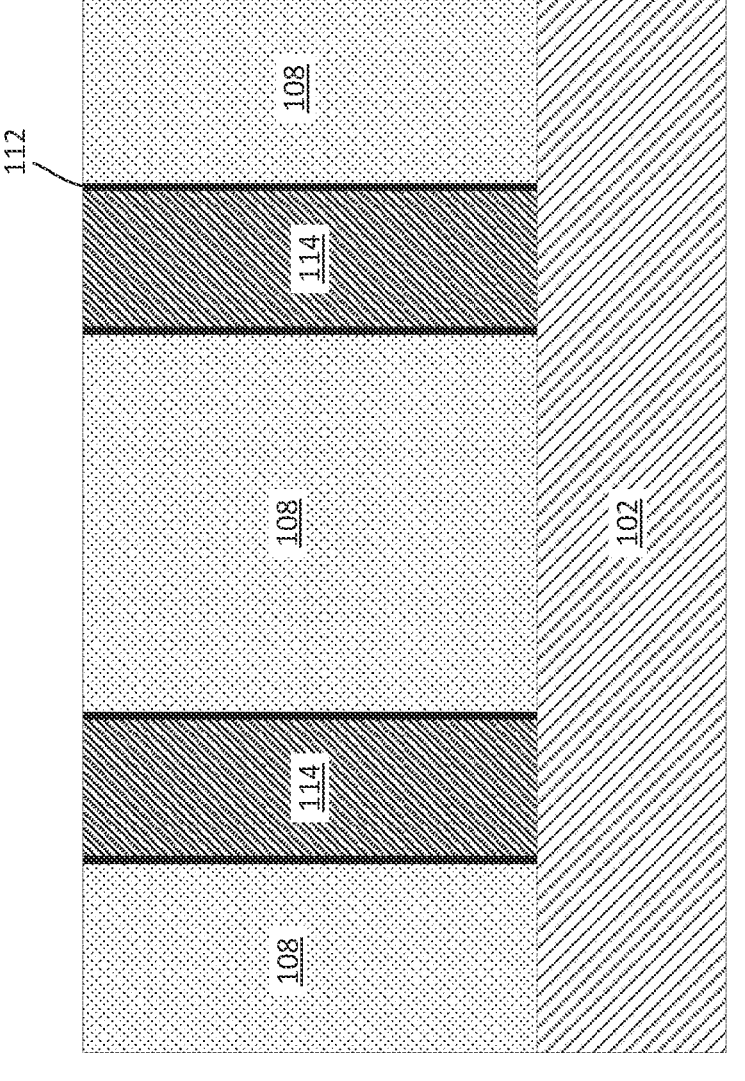
Figure 12A:

FIG. 12A is a cross-sectional view of the ReRAM device of FIG. 11A at a subsequent stage of the manufacturing process, taken along the line A-A of FIG. 6C, according to embodiments.

Figure 12B:
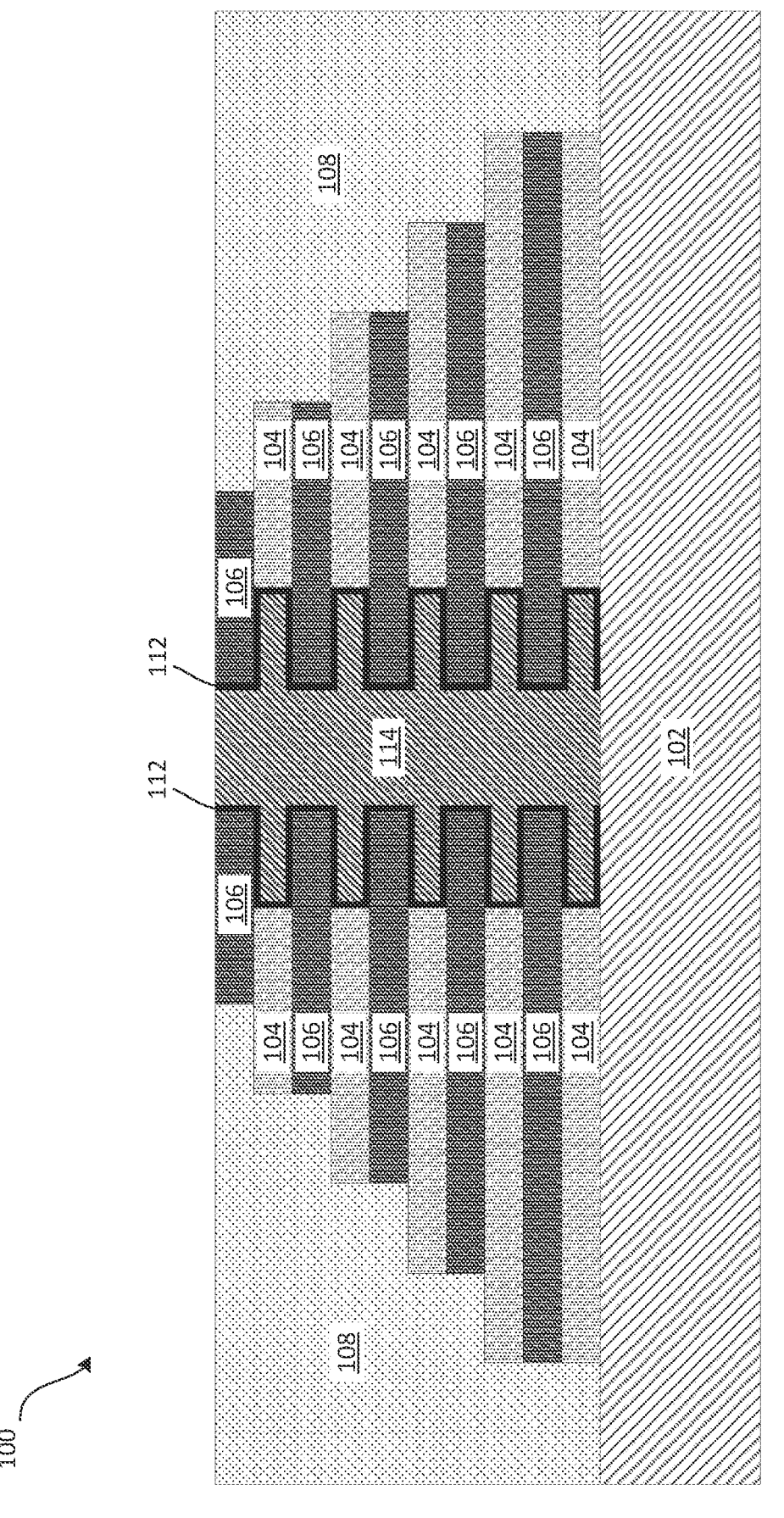

FIG. 12B is a cross-sectional view of the ReRAM device of FIG. 11B at a subsequent stage of the manufacturing process, taken along line B-B of FIG. 6C, according to embodiments.

Figure 13A:
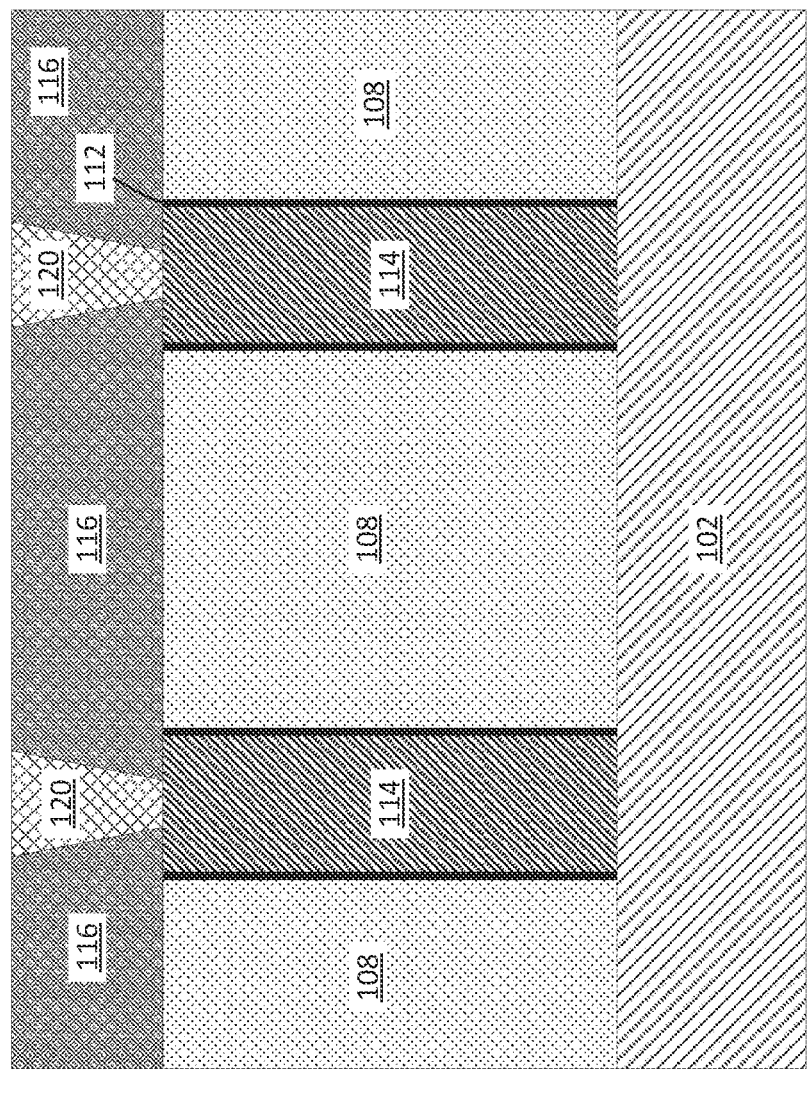
Figure 13A:
Figure 13B:
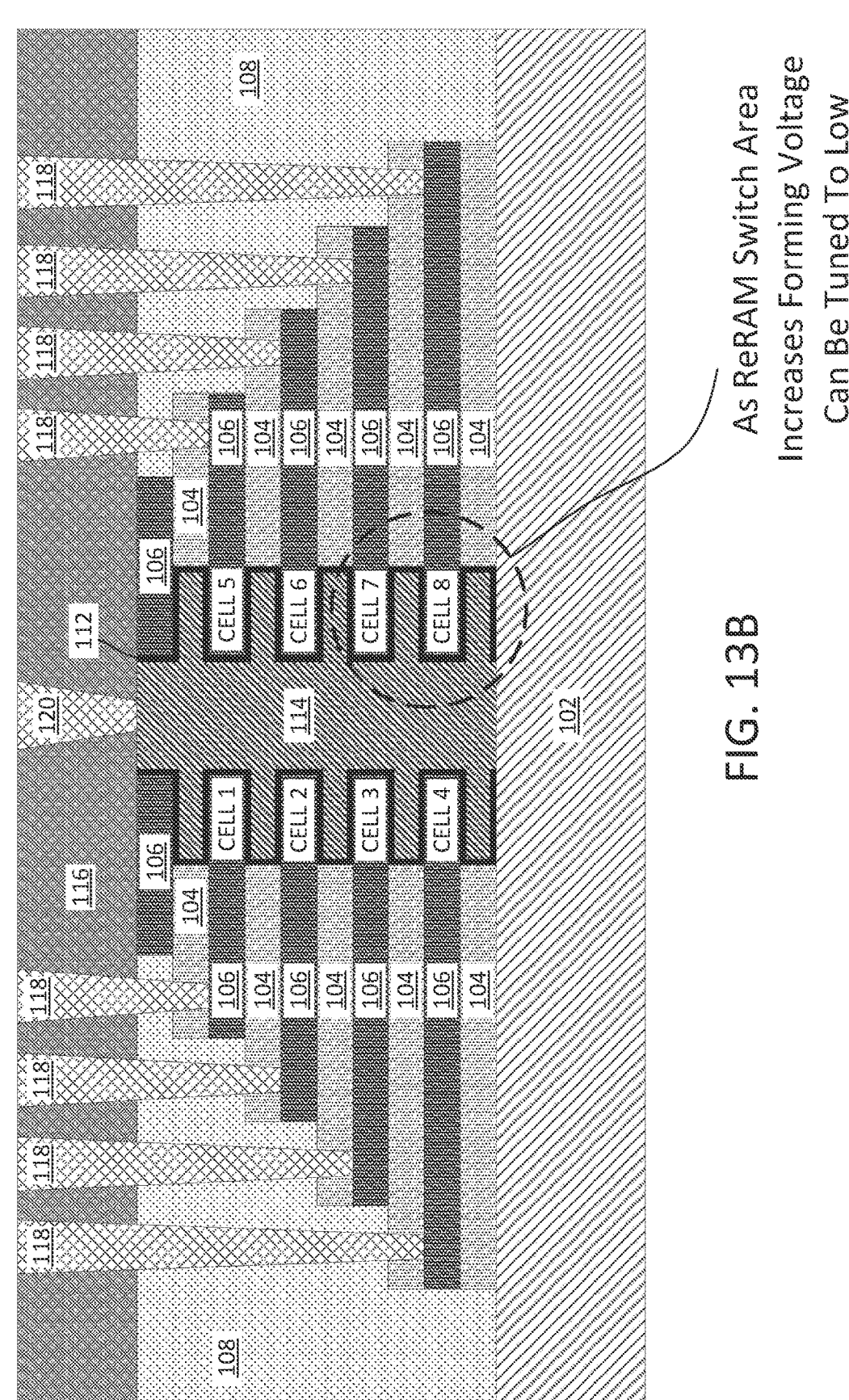
Figure 13C:

FIG. 13A is a cross-sectional view of the ReRAM device of FIG. 12A at a subsequent stage of the manufacturing process, taken along the line A-A of FIG. 13C, according to embodiments.

FIG. 13B is a cross-sectional view of the ReRAM device of FIG. 12B at a subsequent stage of the manufacturing process, taken along line B-B of FIG. 13C, according to embodiments.

FIG. 13C is a top-down view of the ReRAM device of FIGS. 13A and 13B, according to embodiments.

Figure 1A:
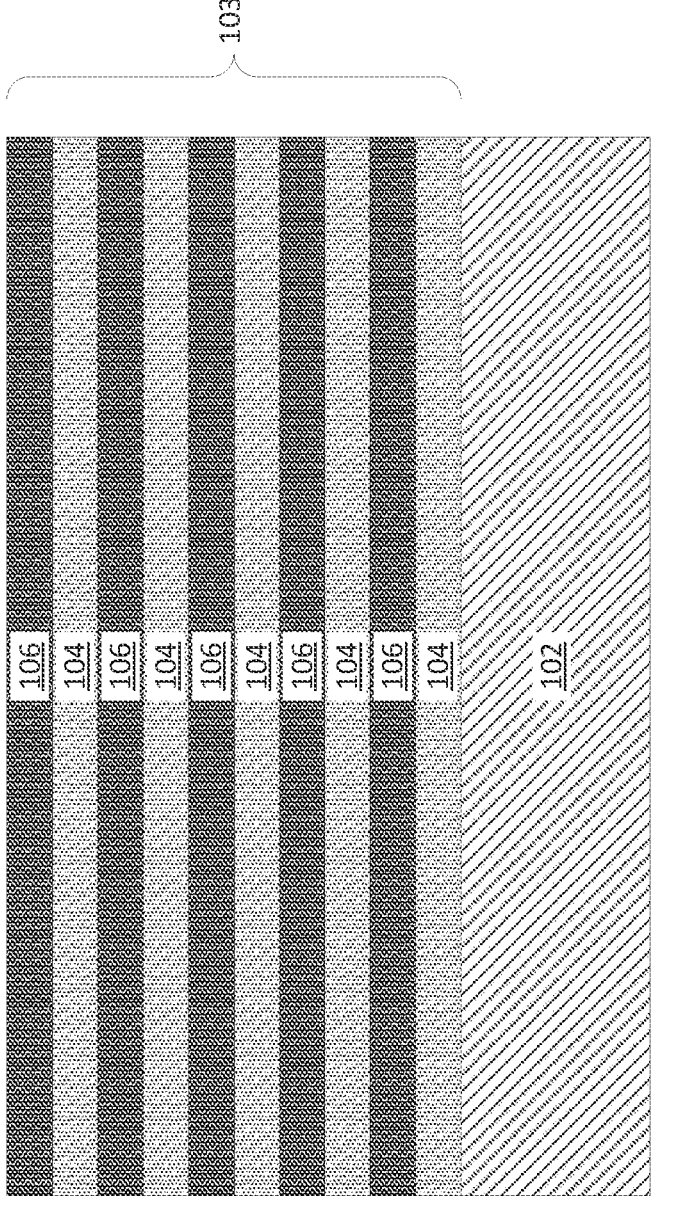
FIG. 1A is a cross-sectional view of a ReRAM device at an intermediate stage of the manufacturing process, taken along line A-A of FIG. 1C, according to embodiments.
Figure 1A:
Figure 1B:
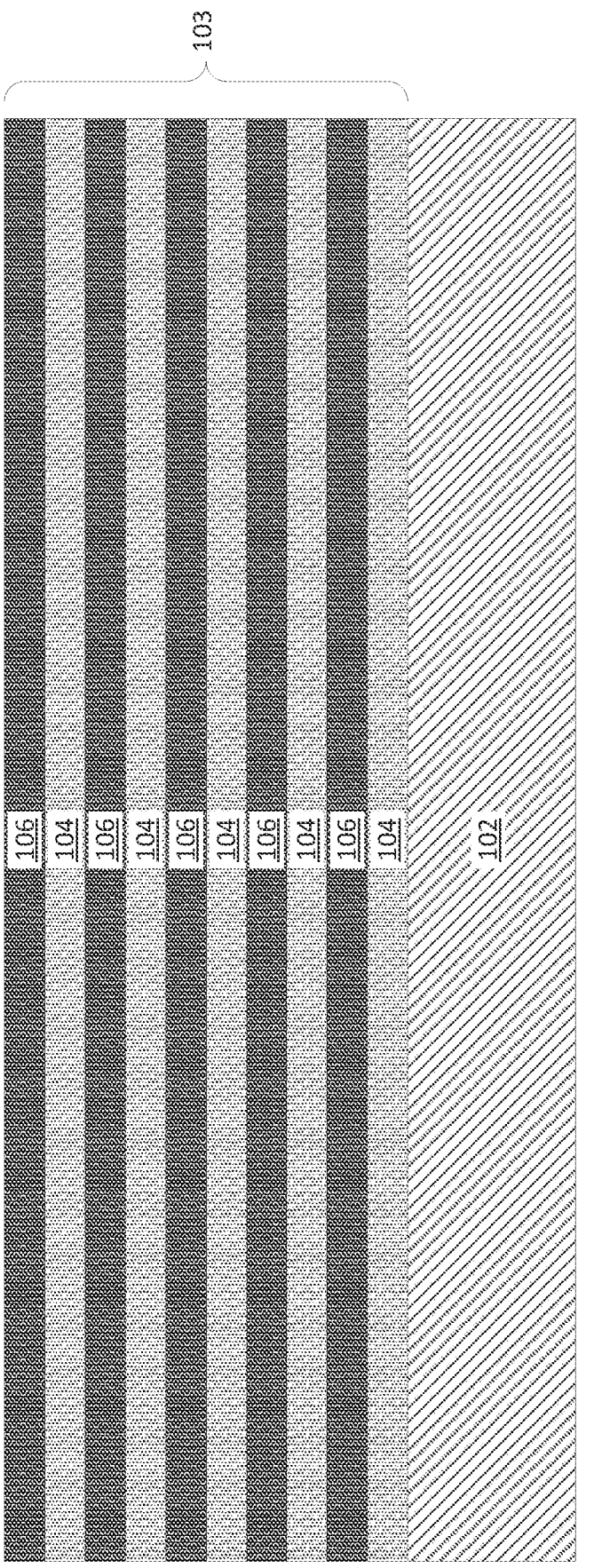
FIG. 1B is a cross-sectional view of the ReRAM device of FIG. 1A, taken along line B-B of FIG. 1C, according to embodiments.
Figure 1C:
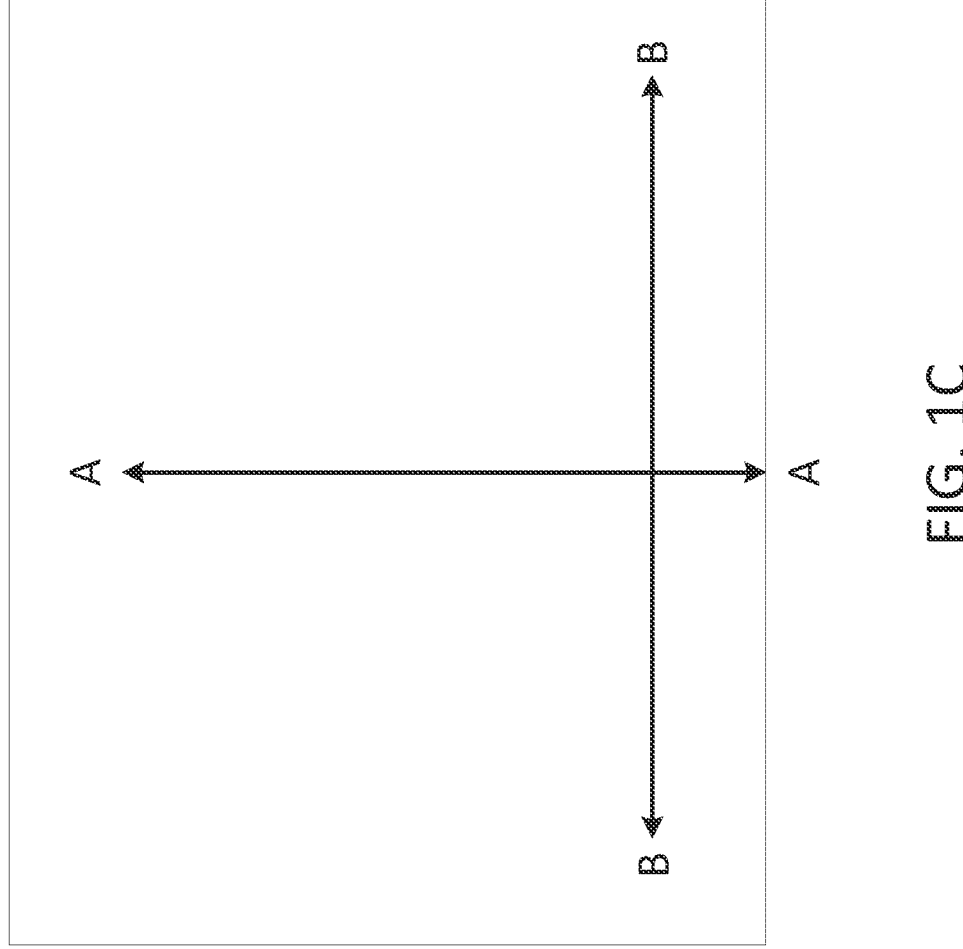
FIG. 1C is a top-down view of the ReRAM device of FIGS. 1A and 1B, according to embodiments.
Figure 1C:
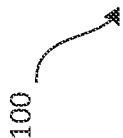
Figure 14A:
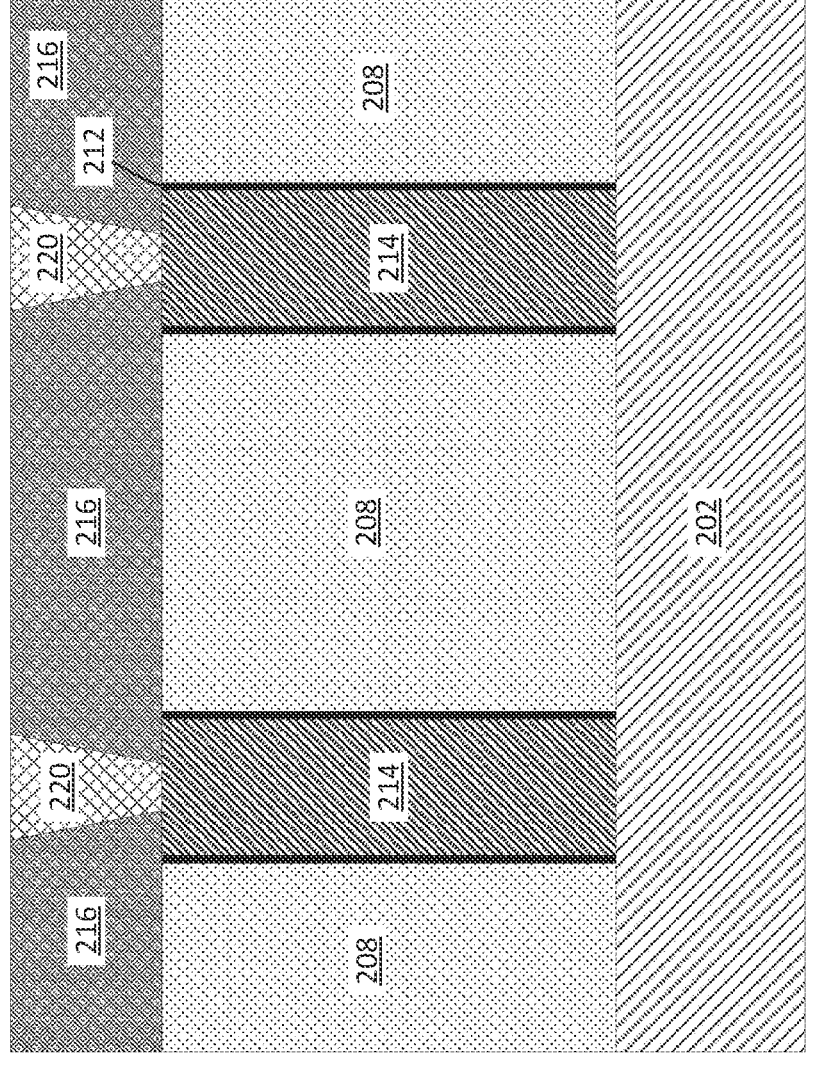
Figure 14A:
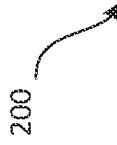

FIG. 14A is a cross-sectional view of a ReRAM device at an intermediate stage of the manufacturing process, taken along line A-A of FIG. 1C, according to embodiments.

Figure 14B:
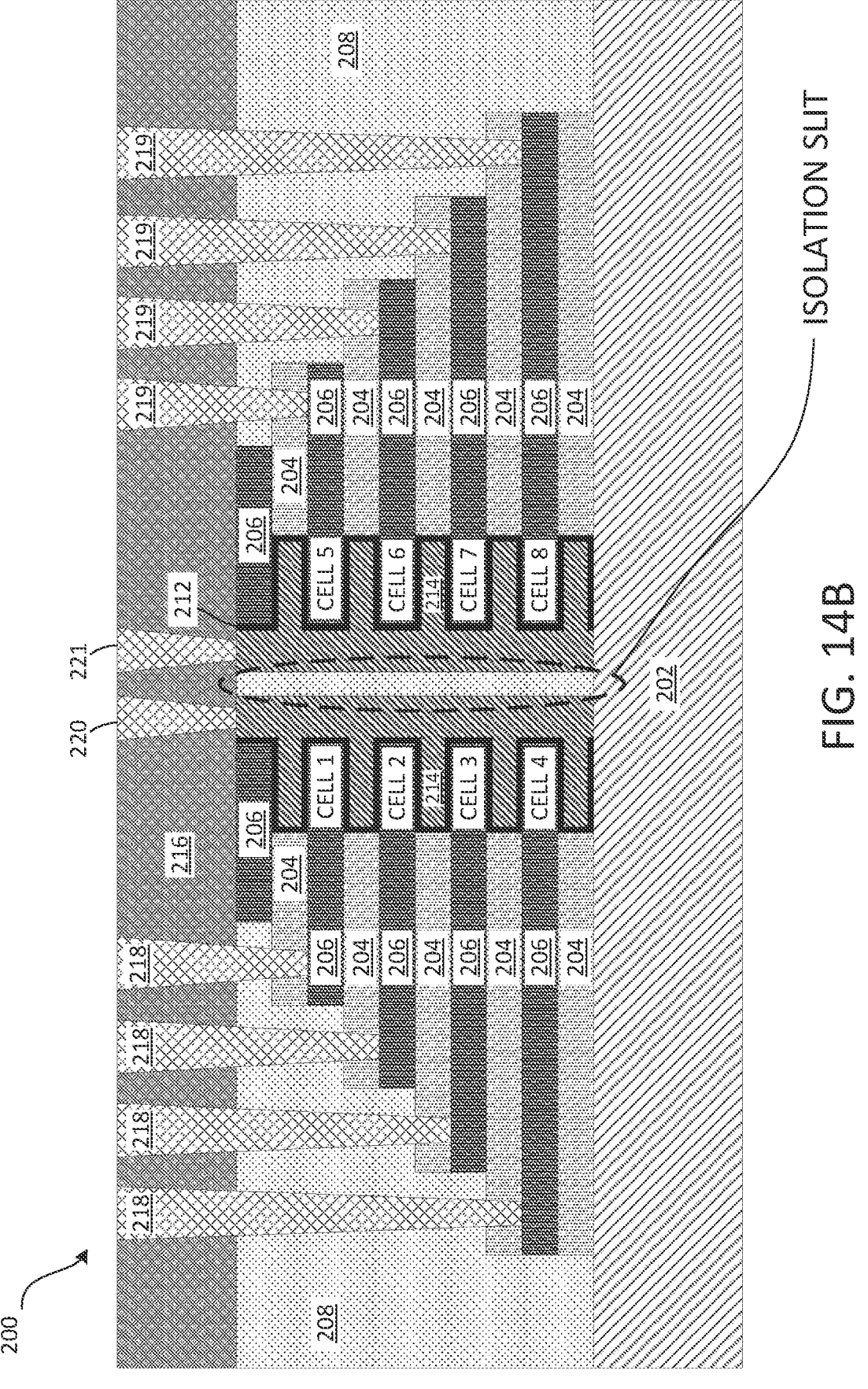
Figure 14C:

FIG. 14B is a cross-sectional view of the ReRAM device of FIG. 14A, taken along line B-B of FIG. 14C, according to embodiments.

FIG. 14C is a top-down view of the ReRAM device of FIGS. 14A and 14B, according to embodiments.

DETAILED DESCRIPTION

The present disclosure generally relates to fabrication methods and resulting structures for semiconductor-based electronic devices. Certain embodiments relate to scalable three-dimensional resistive random access memory (ReRAM) cell structures having a low forming voltage, and methods of fabricating such ReRAM devices. In particular, certain of the present embodiments relate to a ReRAM device including a stepped (or staircase) formation with multiple stacks of ReRAM cells having an increased cell area formed by an isotropic etching (or recessing) of the SiN layers of the various stacked layers.

The flowcharts and cross-sectional diagrams in the Figures illustrate methods of manufacturing nanosheet ReRAM devices according to various embodiments. In some alternative implementations, the manufacturing steps may occur in a different order than that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure of a resistive memory device (e.g., a ReRAM device) that can be used as classic memory applications. The ReRAM device can also be used in neuromorphic computing applications in which each resistive memory device (e.g., a ReRAM device) can be used as a connection (synapse) between a pre-neuron and post-neuron, representing the connection weight in the form of device resistance.

Multiple pre-neurons and post-neurons can be connected through a crossbar array of RRAMs, which naturally expresses a fully-connected neural network.

A crossbar array of RRAM can be made with junction with resistively switching material formed on the bottom electrodes. The top electrodes are formed on the junction with resistively switching material to form a crossbar array of RRAMs.

Non-volatile resistively switching metal oxides, such as $HfO_x$, $TaO_x$, $AlO_x$, $ZrO_x$, $TiO_x$, or a combination of these materials are integrated into nano-crossbar arrays and nanocross-points scaled down to a feature size by electron beam lithography. This enables a fast fabrication route for high density prototype test structures of passive memory cores with two terminal devices. The structures and the integrated material is electrically characterized to gain an insight into the general properties of nano-crossbar arrays with resistively switching metal oxides and to define the demands for an external CMOS control system.

Nonvolatile and resistively switching materials with two or more stable states such as $HfO_x$ are integrated as two terminal memory devices to efficiently create a ReRAM bit pattern. These cells can be integrated into crossbar arrays. The switching material can cover the whole chip area and every junction at a cross point is an addressable cell of a ReRAM. Since the array consists of passive elements, additional active external circuitry is required for the operation to address the cells, set, and reset their state and read the stored information.

Artificial neural networks (ANNs) can be formed from crossbar arrays of resistive processing units (RPUs) that provide local data storage and local data processing without the need for additional processing elements beyond the RPU. The trainable resistive crosspoint devices are referred to as RPUs.

The neurons are integrated in CMOS circuitry with cross bar array of devices, which stores a matrix. The input neurons, along with the hidden neuron layers and output neurons and input signals. The neurons states can be, for example, backward, forward and update.

Crossbar arrays (crosspoint arrays or crosswire arrays) are high density, low cost circuit architectures used to form a variety of electronic circuits and devices, including ANN architectures, neuromorphic microchips, and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which may be formed from thin film material. Crosspoint devices, in effect, function as the ANN's weighted connections between neurons. Nanoscales two-terminal devices, for example memristors having conduction state switching characteristics, are often used as the crosspoint devices in order to emulate synaptic plasticity with high energy efficiency. The conduction state (e.g., resistance) of the memristive material may be altered by controlling the voltages applied between individual wires of the row and column wires.

The Resistive Processing Unit (RPU) can further enhance the functionality of neuromorphic computing. The new class of devices (RPU) that can be used as processing units to accelerate various algorithms including neural network training.

In certain of the present embodiments, in oxide ReRAM cell structures, the devices include a metal oxide layer positioned between a first electrode and a second electrode (i.e., a metal-insulator-metal structure). Oxygen vacancies in the metal oxide layer allow for the electroformation of a current conducting filament (CF) therein. In many ReRAM devices, the mechanism enabling the storage of information is based on the formation and rupture of this CF formed between the two electrodes, resulting in repeatable resistive switching between high resistance states (HRS) and low resistance states (LRS). With regard to the CF, when an oxide metal is sandwiched between two electrodes, when a sufficient positive voltage is applied to the first electrode, the CF will form between the two electrodes, resulting in a low resistance state. In contrast, when a sufficient negative voltage is applied to the second electrode, the CF breaks, resulting in a high resistance state. In certain embodiments of the oxide ReRAM device, the formation of the CF is triggered by field-assisted oxygen ion migrations, resulting in a change in the electronic conductivity (or resistivity) of the switching device, as discussed above. For oxide ReRAM devices, the electroforming of the CF is needed.

Conventional filamentary switching ReRAM devices require a forming step to create a soft breakdown. As the switching area of the ReRAM device scales down, the forming voltages generally increase. Therefore, an external device for providing the high forming voltage may be required, which may result in increased power consumption during the forming step. If the ReRAM switching area is increased in attempt to reduce the forming voltage, there is an area penalty, which reduces the special density of the ReRAM devices.

In certain ReRAM devices of the present embodiments, the devices may have a relatively lower ReRAM forming voltage by increasing the ReRAM cell area on the vertical pillar structure by making a three-dimensional trench for the ReRAM material formation (e.g., the high-K material layer). This may result in an increased density for the ReRAM cells by allowing for a lower forming voltage without the area penalty associated with related ReRAM devices.

Referring now to the drawings in which like numerals represent the same or similar elements and initially to FIG. 1A, this figure is a cross-sectional view of a ReRAM device 100 in an intermediate stage of the manufacturing process, in accordance with certain embodiments. As shown in FIG. 1A, a base layer or first dielectric layer 102 if provided. In certain embodiments, the first dielectric layer 102 may be provided on a semiconductor substrate (not shown) that includes a semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), II-V compound semiconductor or another like semiconductor. In addition, multiple layers of the semiconductor materials can be used as the semiconductor material of the substrate. The semiconductor substrate can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide or nitride layer. In FIG. 1A the first dielectric layer 102 is shown as the bottom layer for the sake of simplicity and ease of illustration. The first dielectric layer 102 may also include one or more other devices such as transistors, diodes, capacitors, interconnects, isolation structures, contacts, wires, etc.

As shown in FIGS. 1A and 1B, a multi-layer memory stack 103 structure is formed on the first dielectric layer 102. The multi-layer memory stack 103 includes a plurality of alternating insulating layers and metal layers that will be used to form the plurality of memory cells described in further detail below. The insulating layers 104 may comprise, for example, SiN or SiO₂, for example. However, it should be appreciated that the alternating insulating layers 104 of the multi-layer memory stack 103 may comprise any suitable insulating material(s). The metal layers 106 of the multi-layer memory stack 103 may comprise, for example, Pt, tantalum nitride (TaN), titanium aluminum carbide (TiAlC), tungsten, TiN, copper (Cu), cobalt (Co), aluminum (Al), ruthenium (Ru), tantalum (Ta), nickel (Ni), etc. may be used. It should be appreciated that other suitable materials may be used for the metal layers 106. In certain embodiments, the materials for the metal layers 106 and the insulating layers 104 are selected such that the insulating layers 104 can be selectively etched relative to the metal layers 106. In an example, a thickness of the metal layers 106 is about 3 nm and they can be used as a first electrode (also referred to as the "bottom electrode") for the ReRAM devices 100. However, it should be appreciated that other suitable thicknesses of the metal layers 106 may be used. In certain examples, the metal layers 106 may be a word line of the ReRAM device array. FIG. 1C is a top-down view of the ReRAM device 100 of FIGS. 1A and 1B, showing the approximate locations of the cross-sectional cut lines A-A of FIGS. 1A and B-B of FIG. 1B.

Figure 2A:
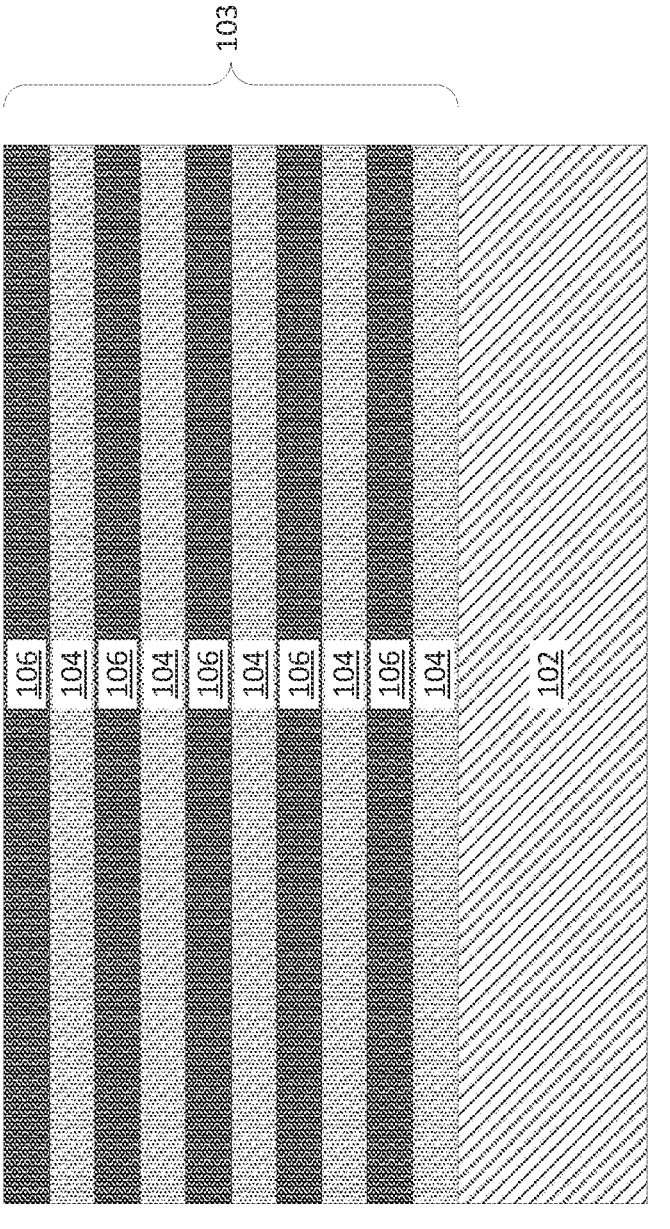
FIG. 2A is a cross-sectional view of the ReRAM device of FIG. 1A at a subsequent stage of the manufacturing process, taken along the line A-A of FIG. 1C, according to embodiments.
Figure 2A:
Figure 2B:
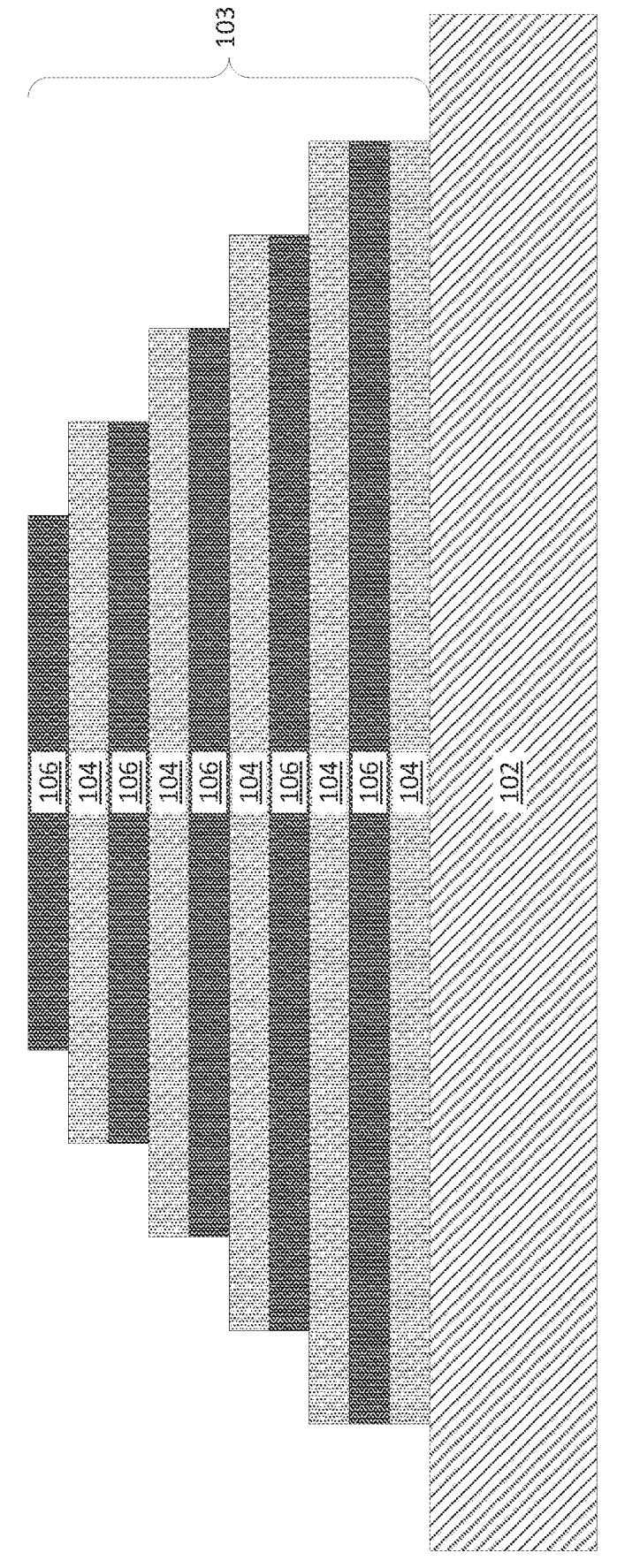
FIG. 2B is a cross-sectional view of the ReRAM device of FIG. 1B at a subsequent stage of the manufacturing process, taken along line B-B of FIG. 1C, according to embodiments.

Referring now to FIG. 2B, this figure is a cross-sectional view of the ReRAM device of FIG. 1A at a subsequent stage of the manufacturing process, taken along the line B-B of FIG. 1C, according to embodiments. As shown in FIG. 2B, several etching steps are performed to create the staircase (or stepped) configuration of the multi-layer memory stack 103. In one example, reactive ion etching (RIE) is performed several times to create the three-dimensional vertical ReRAM structure shown in FIG. 2B, where the B-B distance (width) of each successive set of layers (i.e., a combination of insulating layers 104 and metal layers 106) is gradually reduced toward the top. It should be appreciated that the stepped portions will allow for pillar electrodes to make contact with the different ReRAM devices, as discussed in further detail below. It should be appreciated that any suitable combination of patterning and material removal steps known to one of skill in the art may be used to create the staircase (or stepped) configuration shown in FIG. 2B. FIG. 2A is a cross-sectional view of the ReRAM device of FIG. 1A at a subsequent stage of the manufacturing process, taken along line A-A of FIG. 1C, according to embodiments. The cross-sectional of FIG. 2A is the same as the cross-sectional view of FIG. 1A.

Figure 3A:
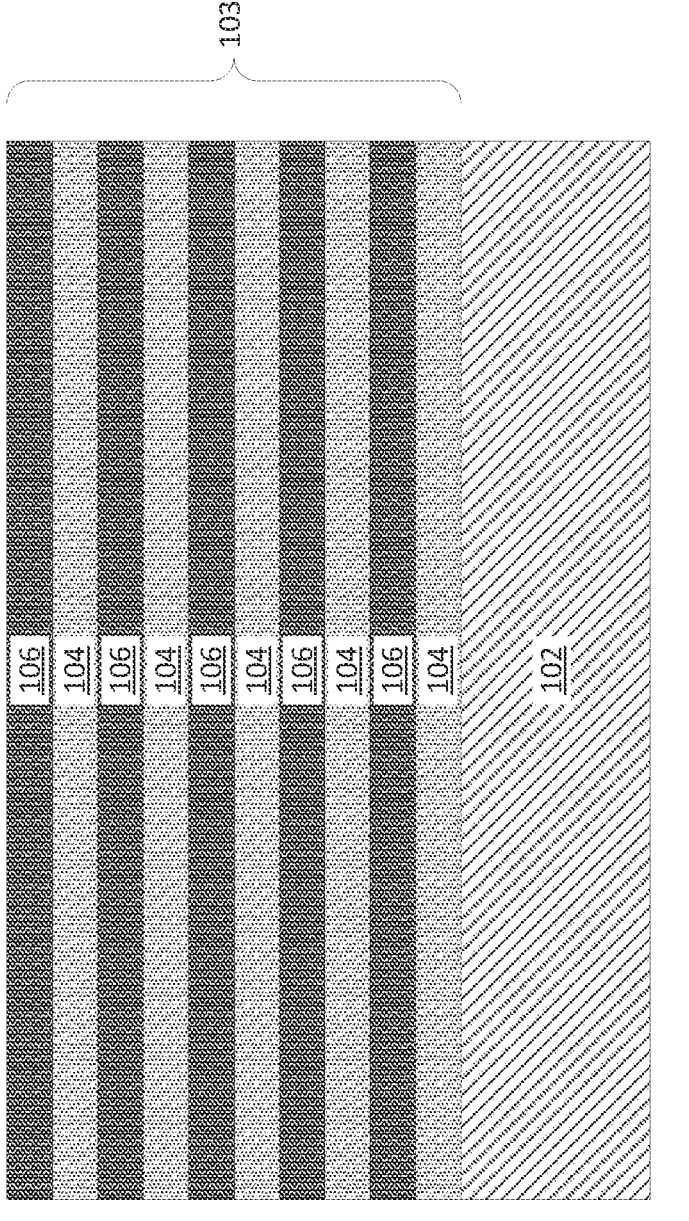
FIG. 3A is a cross-sectional view of the ReRAM device of FIG. 2A at a subsequent stage of the manufacturing process, taken along the line A-A of FIG. 1C, according to embodiments.
Figure 3A:
Figure 3B:
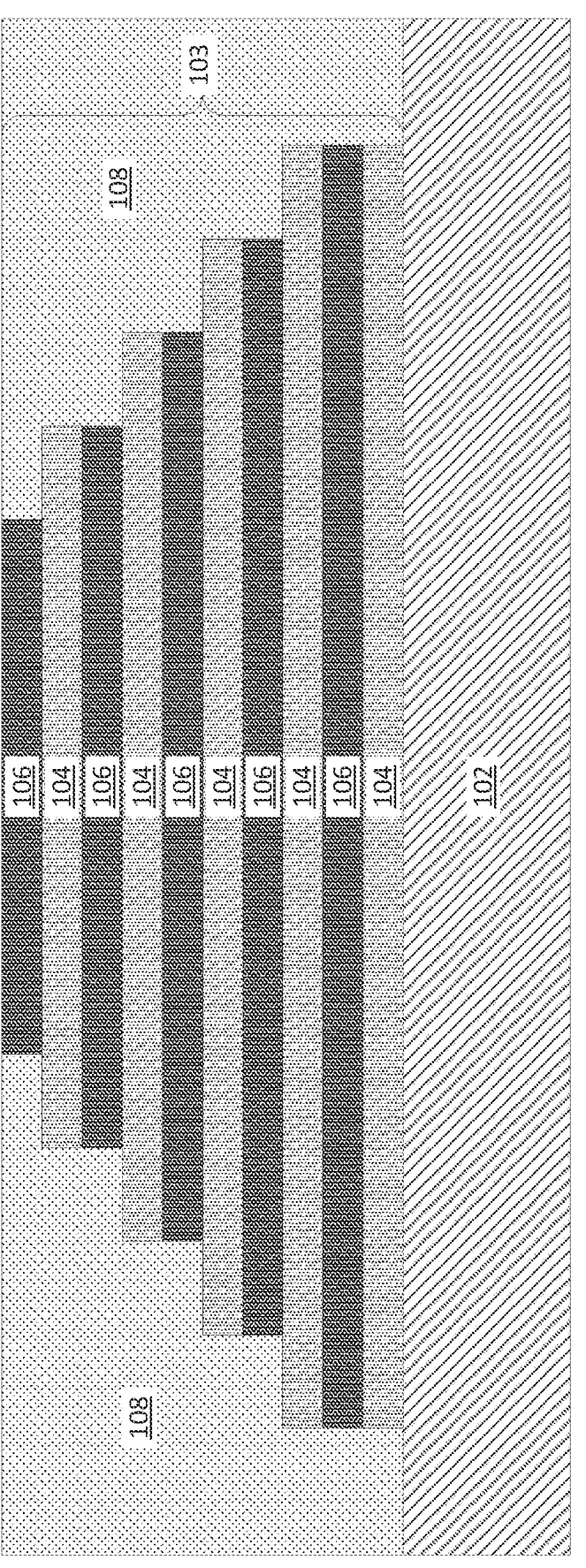
FIG. 3B is a cross-sectional view of the ReRAM device of FIG. 2B at a subsequent stage of the manufacturing process, taken along line B-B of FIG. 1C, according to embodiments.

Referring now to FIG. 3B is a cross-sectional view of the ReRAM device 100 of FIG. 2B at a subsequent stage of the manufacturing process, taken along line B-B of FIG. 1C, according to embodiments. As shown in FIG. 3B, a first interlayer dielectric (ILD) layer 108 is deposited around the multi-layer memory stack 103. The material of the first ILD layer 108 may be SiO₂, or any other suitable ILD material. In certain embodiments, after the first ILD layer 108 is deposited, a suitable material removal operation such as CMP may be performed so that the upper surface of the topmost metal layer 106 in the multi-layer memory stack 103 is coplanar with the upper surface of the first ILD layer 108. FIG. 3A is a cross-sectional view of the ReRAM device of FIG. 2A at a subsequent stage of the manufacturing process, taken along the line A-A of FIG. 1C, according to embodiments. The cross-sectional of FIG. 3A is the same as the cross-sectional view of FIG. 2A.

Figure 4A:
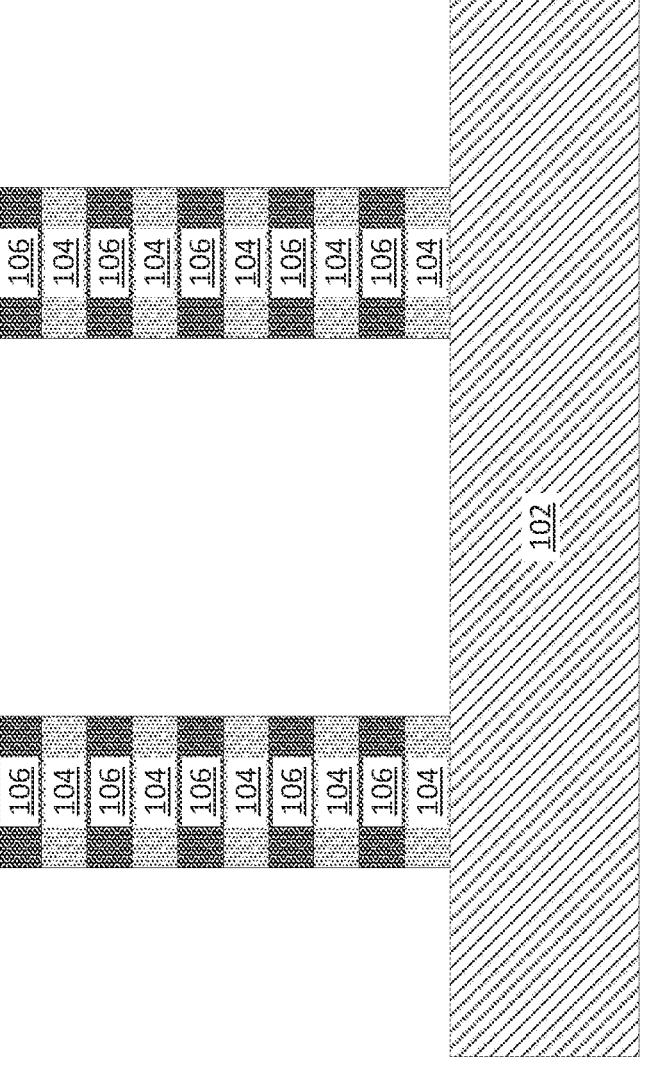
FIG. 4A is a cross-sectional view of the ReRAM device of FIG. 3A at a subsequent stage of the manufacturing process, taken along the line A-A of FIG. 4C, according to embodiments.
Figure 4A:
Figure 4B:
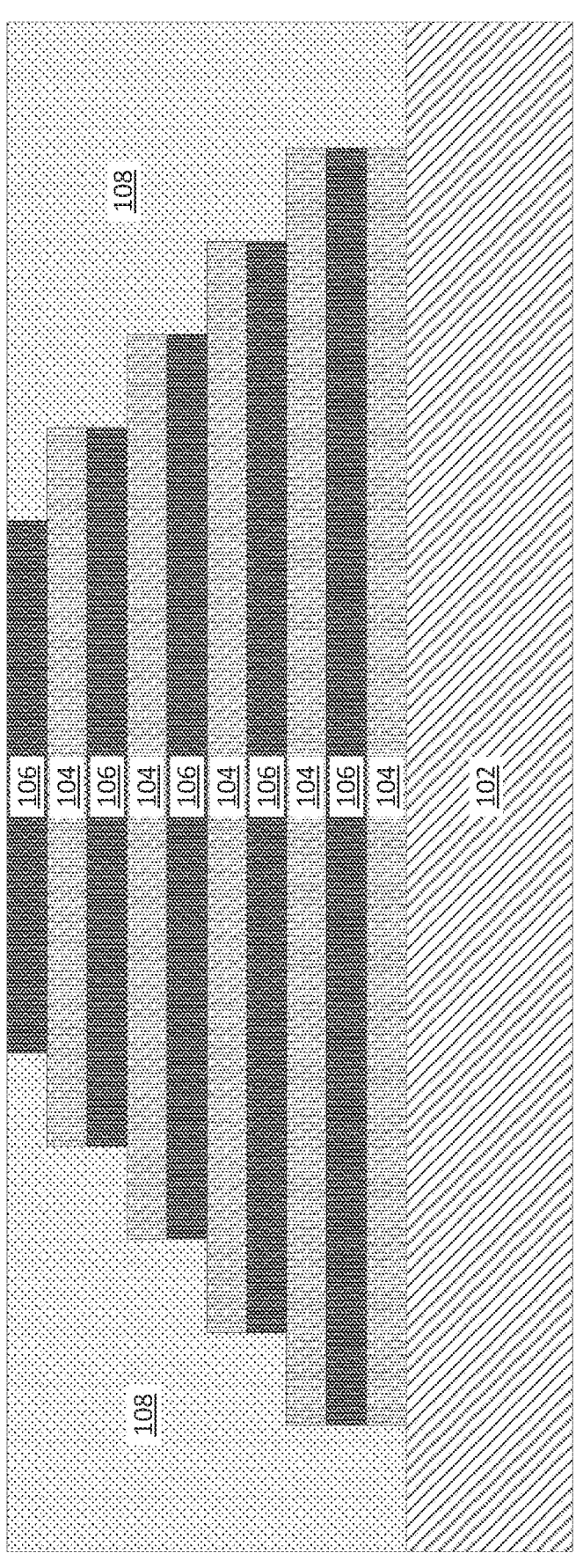
FIG. 4B is a cross-sectional view of the ReRAM device of FIG. 3B at a subsequent stage of the manufacturing process, taken along line B-B of FIG. 4C, according to embodiments.
Figure 4C:
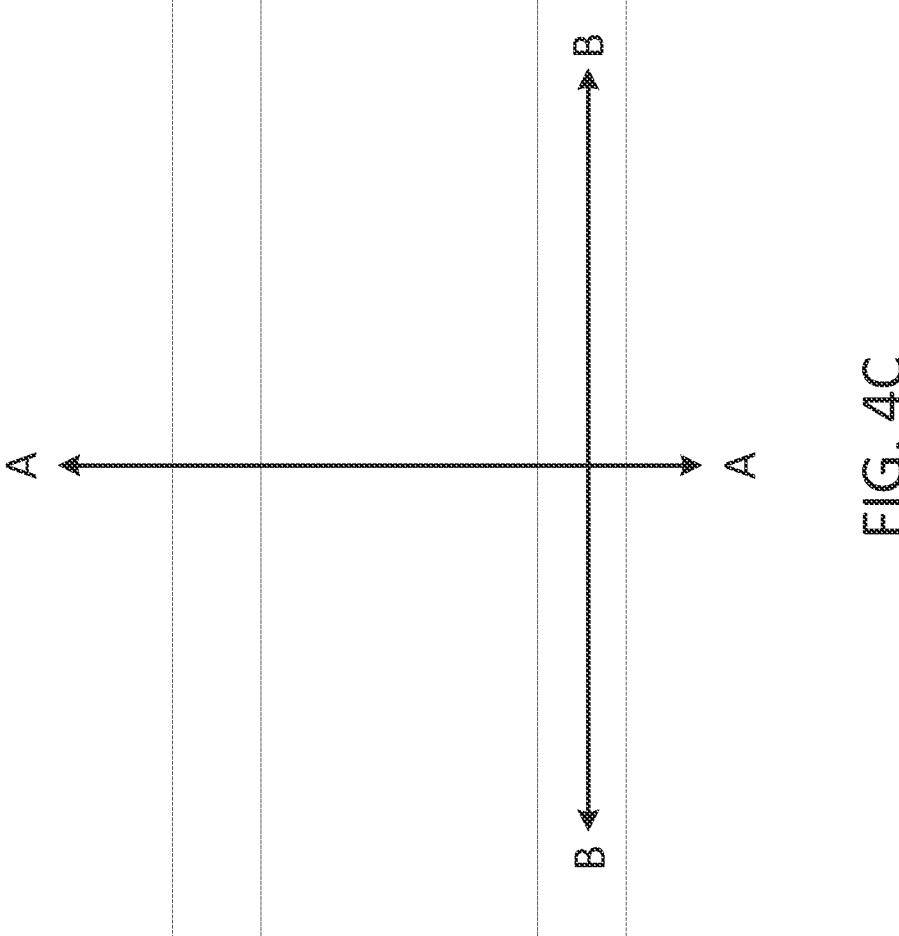
FIG. 4C is a top-down view of the ReRAM device of FIGS. 4A and 4B, according to embodiments.
Figure 4C:
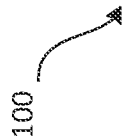

Referring now to FIG. 4A, this figure is a cross-sectional view of the ReRAM device 100 of FIG. 3A at a subsequent stage of the manufacturing process, taken along the line A-A of FIG. 4C, according to embodiments. As shown in FIG. 4A, a patterning process is performed using, for example, RIE, to form the memory stack. The material of the first ILD layer 108 is removed down to the level of the first dielectric layer 102. In the example shown in FIG. 4A, two pillars of alternating layers of insulating layers 104 and metal layers 106 are formed. FIG. 4B is a cross-sectional view of the ReRAM device of FIG. 3B at a subsequent stage of the manufacturing process, taken along line B-B of FIG. 4C, according to embodiments. The cross-sectional of FIG. 4B is the same as the cross-sectional view of FIG. 3B. FIG. 4C is a top-down view of the ReRAM device of FIGS. 4A and 4B, according to embodiments, and shows the approximate location of the patterning of the ReRAM device 100 along cut lines A-A and B-B.

Figure 5A:
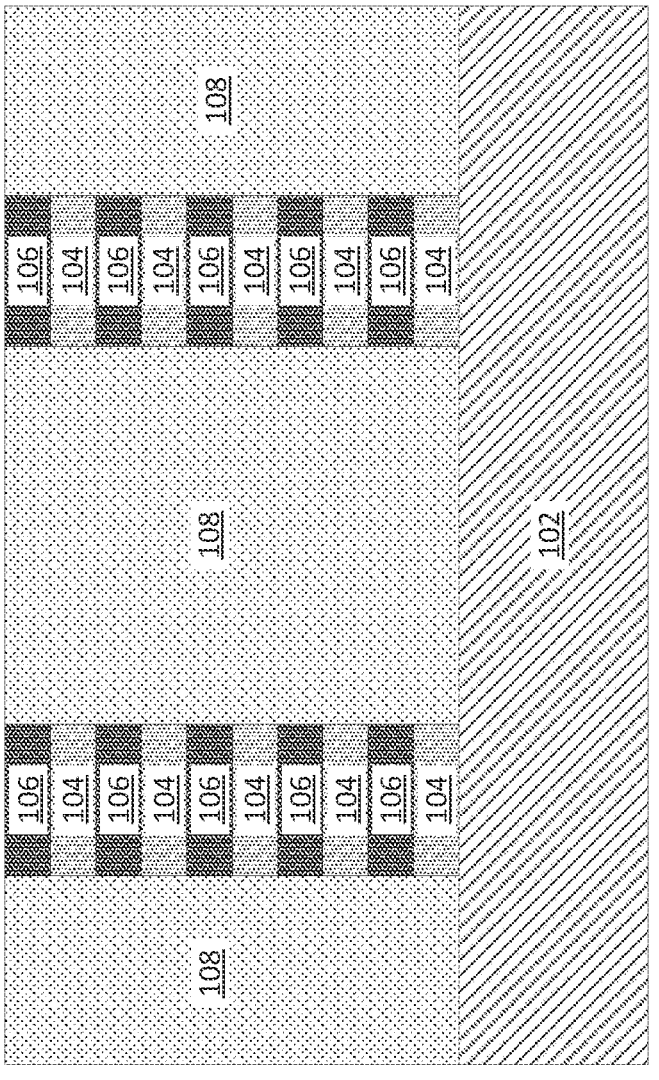
FIG. 5A is a cross-sectional view of the ReRAM device of FIG. 4A at a subsequent stage of the manufacturing process, taken along the line A-A of FIG. 5C, according to embodiments.
Figure 5A:
Figure 5B:
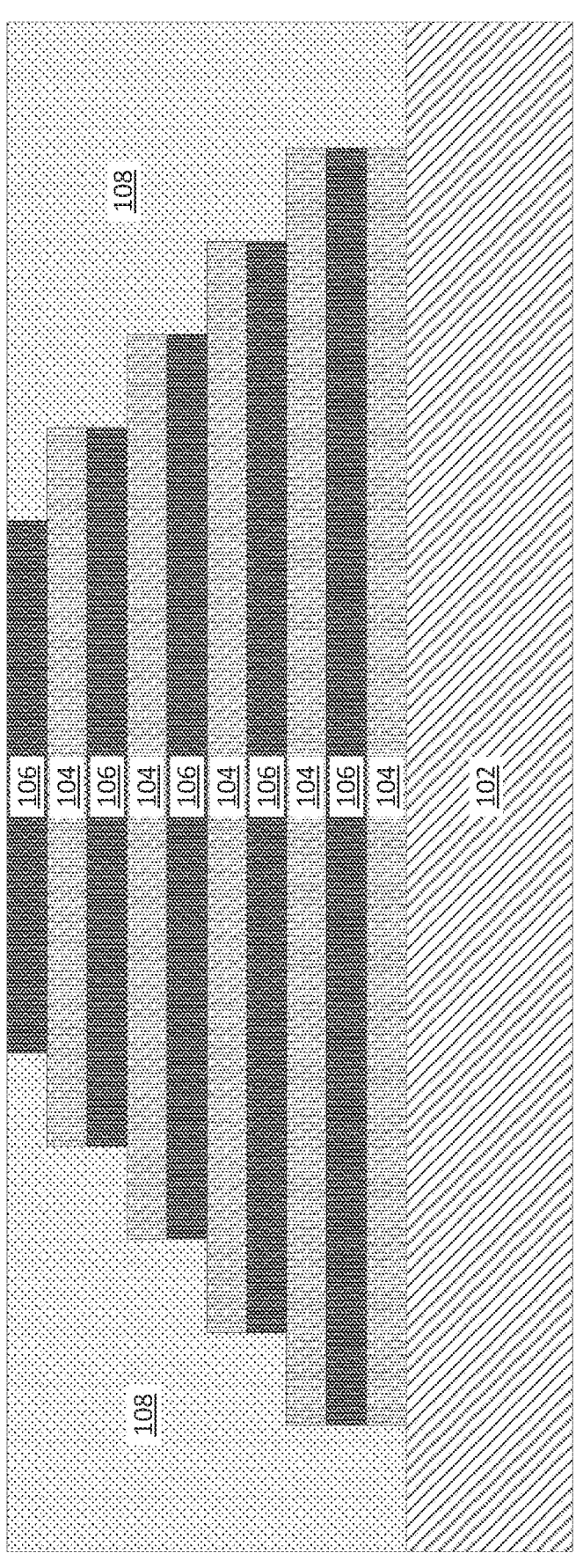
FIG. 5B is a cross-sectional view of the ReRAM device of FIG. 4B at a subsequent stage of the manufacturing process, taken along line B-B of FIG. 5C, according to embodiments.
Figure 5C:
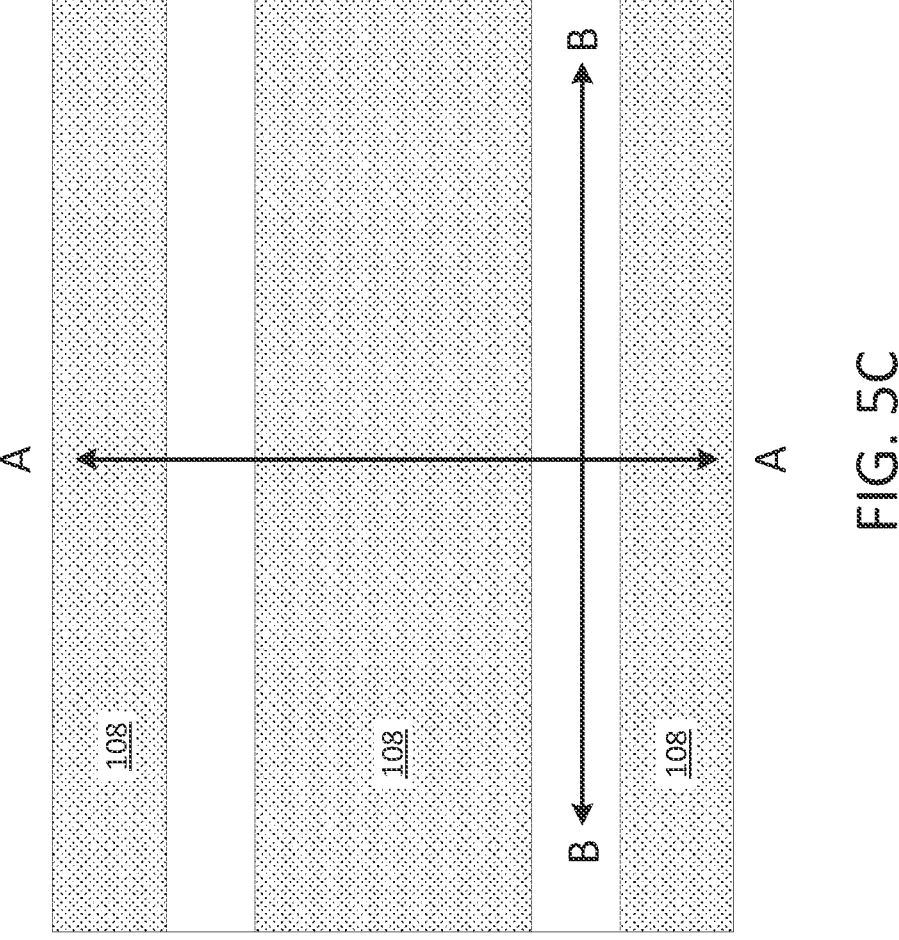
FIG. 5C is a top-down view of the ReRAM device of FIGS. 5A and 5B, according to embodiments.
Figure 5C:
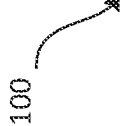

Referring now to FIG. 5A, this figure is a cross-sectional view of the ReRAM device 100 of FIG. 4A at a subsequent stage of the manufacturing process, taken along the line A-A of FIG. 5C, according to embodiments. As shown in FIG. 5A, additional ILD material is deposited to fill in the gaps formed between (and around) the two memory stack pillars shown in FIG. 4A. This additional ILD material may be the same as that of the first ILD layer 108, and it may be thought of as a continuation of the formation of the first ILD layer 108 shown in FIG. 3B. However, it should be appreciated that this additional material may be a different dielectric material than that of the first ILD layer 108, and the first ILD layer 108 may be a multilayered ILD structure. In certain embodiments, after the additional material of the first ILD layer 108 is deposited, a suitable material removal operation such as CMP may once again be performed so that the upper surface of the topmost metal layer 106 in the multi-layer memory stack 103 is coplanar with the upper surface of the first ILD layer 108. FIG. 5B is a cross-sectional view of the ReRAM device of FIG. 4B at a subsequent stage of the manufacturing process, taken along line B-B of FIG. 5C, according to embodiments. The cross-sectional of FIG. 5B is the same as the cross-sectional view of FIG. 4B. FIG. 5C is a top-down view of the ReRAM device of FIGS. 5A and 5B, according to embodiments, and includes a designation of the coverage of the first ILD layer 108 in plan view.

Referring now to FIG. 6A, this figure is a cross-sectional view of the ReRAM device 100 of FIG. 5A at a subsequent stage of the manufacturing process, taken along the line A-A of FIG. 6C, according to embodiments. As shown in FIG. 6A, contact patterning is performed by first depositing an organic planarization (OPL) layer 110 on top of the first ILD layer 108 and on top of the uppermost metal layer 106. Then, as shown in FIG. 6A, portions of the OPL layer 110 are removed to expose the tops of the two multi-layer memory stacks 103. This OPL layer 110 will serve as a mask to allow for subsequent removal of portions of the multi-layer memory stacks 103 where the electrical contacts will be formed. FIG. 6B is a cross-sectional view of the ReRAM device of FIG. 5B at a subsequent stage of the manufacturing process, taken along line B-B of FIG. 6C, according to embodiments. As shown in FIG. 6B, the opening in the OPL layer 110 is roughly in the middle portion of the multi-layer memory stacks 103, which will allow for dividing these multi-layer memory stacks 103 into two sides through a subsequent etching operation described below. FIG. 6C is a top-down view of the ReRAM device of FIGS. 6A and 6B, according to embodiments. FIG. 6 shows the approximate locations of the openings in the OPL layer 110 along the A-A and B-B cutlines.

Referring now to FIG. 7A, this figure is a cross-sectional view of the ReRAM device 100 of FIG. 6A at a subsequent stage of the manufacturing process, taken along the line A-A of FIG. 6C, according to embodiments. As shown in FIG. 7A, a material removal process is used to remove the material of each of the multi-layer memory stacks 103 in the areas corresponding to the openings in the OPL layer 110 discussed above. For example, as shown in FIG. 7A, RIE is performed to remove the plurality of insulating layers 104 and metal layers 106 so as to expose the underlying first dielectric layer 102.

FIG. 7B is a cross-sectional view of the ReRAM device 100 of FIG. 6B at a subsequent stage of the manufacturing process, taken along line B-B of FIG. 6C, according to embodiments. As shown in FIG. 7B, after the RIE process is performed to remove the portions of the multi-layer memory stack 103 not covered by the OPL layer 110, the sidewalls (i.e., sidewalls of the insulating layers and metal layers 106) of the right and left portions of the three-dimensional stepped memory stack structure that are facing each other are exposed to allow for further processing operations, as discussed below.

Referring now to FIG. 8A, this figure is a cross-sectional view of the ReRAM device 100 of FIG. 7A at a subsequent stage of the manufacturing process, taken along the line A-A of FIG. 6C, according to embodiments. As shown in FIG. 8A and FIG. 8B (which is a cross-sectional view of the ReRAM device of FIG. 7B at a subsequent stage of the manufacturing process, taken along line B-B of FIG. 6C), the OPL layer 110 is removed with any suitable material removal process known to one of skill in the art.

Referring now to FIG. 9B, this figure is a cross-sectional view of the ReRAM device 100 of FIG. 8B at a subsequent stage of the manufacturing process, taken along line B-B of FIG. 6C, according to embodiments. As shown in FIG. 9B, a suitable material removal process (e.g., wet etching) such as an isotropic etching is performed to recess the material of the insulating layers 104. In certain embodiments, an appropriate etchant is used that has a selectivity toward the material of the insulating layers 104 over both the material of the metal layers 106 and the first dielectric layer 102. In other words, the etchant will remove relatively large amounts of the insulating layers 104 in a lateral direction without significantly removing material of either the metal layers 106 or the first dielectric layer 102. Thus, a resulting structure of the processed multi-level memory stacks 103 is such that the insulating layers 104 are recessed inwardly in a lateral direction (parallel to a main surface of the first dielectric layer 102) relative to the metal layers 106. In other words, the metal layers 106 extend further relative to the insulating layers 104. This will allow for the formation of multiple stacks of ReRAM cells having an increased cell area formed by this isotropic etching (or recessing) of the SiN material of the insulating layers 104, as discussed in further detail below. FIG. 9A is a cross-sectional view of the ReRAM device of FIG. 8A at a subsequent stage of the manufacturing process, taken along the line A-A of FIG. 6C, according to embodiments. The cross-sectional of FIG. 9A is the same as the cross-sectional view of FIG. 8A.

Referring now to FIG. 10A, this figure is a cross-sectional view of the ReRAM device 100 of FIG. 9A at a subsequent stage of the manufacturing process, taken along the line A-A of FIG. 6C, according to embodiments. As shown in FIG. 10A, a suitable material deposition operation is performed to deposit a, for example, high-K material layer 112 (or resistive switching layer) on all exposed vertical and horizontal surfaces of the ReRAM device 100 (i.e., on the first ILD layer 108 and the first dielectric layer 102 in FIG. 10A). The high-K material layer 112 can be composed of a high-K material having a dielectric constant greater than 4.0. Exemplary high-K dielectrics include, but are not limited to, $HfO_2$, $ZrO_2$, $La_2O_3$, $Al_2O_3$, $TiO_2$, $SrTiO_3$, $LaALO_3$, $Y_2O_3$, $HfO_xN_y$, $ZrO_xN_y$, $La_2O_xN_y$, $Al_2O_xN_y$, $TiO_x$ $N_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In one embodiment, the high-k material layer 112 can have a thickness in a range from 1 nm to 10 nm. Other thicknesses that are lesser than, or greater than, the aforementioned thickness range can also be employed for the high-K material layer 112.

FIG. 10B is a cross-sectional view of the ReRAM device 100 of FIG. 9B at a subsequent stage of the manufacturing process, taken along line B-B of FIG. 6C, according to embodiments. As shown in FIG. 10B, the high-k material layer 112 covers all the exposed horizontal and vertical surfaces of the ReRAM device 100 (e.g., on the first ILD layer 108, the metal layers 106, the first dielectric layer 102 and the insulating layers 104 shown in FIG. 10B). Thus, as opposed to a configuration where the insulating layers 104 are not recessed (i.e., where only the smaller sidewall surface area of the metal layers 106 would be covered by the high-k material layer 112), both the sidewall surfaces of the metal layers 106, and the upper and lower surfaces of the metal layers 106 that are protruding outward from the insulating layers 104 are covered by the high-K material layer 112.

Referring now to FIG. 11A, this figure is a cross-sectional view of the ReRAM device 100 of FIG. 10A at a subsequent stage of the manufacturing process, taken along the line A-A of FIG. 6C, according to embodiments. As shown in FIG. 11A, a suitable material removal process is used to remove certain of the horizontal portions of the high-K material layer 112. For example, an isotropic RIE etching process may be performed on the high-κ material layer 112. In particular, as shown in FIG. 11A, after the isotropic etching process is performed, the only portions of the high-κ material layer 112 that remain are those portions on the sidewalls of the first ILD layer 108.

FIG. 11B is a cross-sectional view of the ReRAM device 100 of FIG. 10B at a subsequent stage of the manufacturing process, taken along line B-B of FIG. 6C, according to embodiments. As shown in FIG. 1B, after the isotropic etching process is performed, the only portions of the high-κ material layer 112 that remain are those portions on the sidewalls of the metal layers 106, the sidewalls of the insulating layers 104, and on the upper and lower surfaces of the portion of the metal layers 106 that are protruding outward from the insulating layers 104. Thus, even with the removal of the horizontal portions of the high-κ material layer 112 exposed to the RIE process, as opposed to a configuration where the insulating layers 104 are not recessed (i.e., where only the smaller sidewall surface area of the metal layers 106 would be covered by the high-κ material layer 112), both the sidewall surfaces of the metal layers 106, and the upper and lower surfaces of the metal layers 106 that are protruding outward from the insulating layers 104 are covered by the high-κ material layer 112.

Referring now to FIG. 12A, this figure is a cross-sectional view of the ReRAM device 100 of FIG. 11A at a subsequent stage of the manufacturing process, taken along the line A-A of FIG. 6C, according to embodiments. As shown in FIG. 12A, a top electrode 114 is formed of a suitable conductive electrode material(s) in the gaps between the sections of the first ILD layer 108, where the high-κ material layer 112 is between the top electrode 114 and the first ILD layer 108. FIG. 12B is a cross-sectional view of the ReRAM device 100 of FIG. 11B at a subsequent stage of the manufacturing process, taken along line B-B of FIG. 6C, according to embodiments. As shown in FIG. 12B, the top electrode 114 is formed all the way into the areas where the insulating layers 104 were recessed. As mentioned above, related filamentary switching ReRAM devices require a forming step to create soft breakdown. As the switching area scales down, the forming voltages increases so that additional external devices providing a high forming voltage may be required. In related devices, if ReRAM switching area increases to reduce the forming voltage, there is an area penalty. However, the present embodiments provide a solution that allows for increased switching area (i.e., the interface between a top surface of the protruding portion of the metal layer 106 and the top electrode 114, the interface between a bottom surface of the protruding portion of the metal layer 106 and the top electrode 114, and the interface between the sidewalls of the protruding portion of the metal layer 106 and the top electrode 114) without incurring a penalty in the overall footprint of the ReRAM device 100. Thus, the filament formation voltage can be maintained at a lower level without sacrificing the footprint of the overall device. In certain examples, a suitable material removal process such as CMP may be performed to remove excess top electrode 114 material and make the upper surface of the top electrode 114 coplanar with the top surface of the first ILD layer 108.

Referring now to FIG. 13A, this figure is a cross-sectional view of the ReRAM device 100 of FIG. 12A at a subsequent stage of the manufacturing process, taken along the line A-A of FIG. 13C, according to embodiments. As shown in FIG. 13A, a second ILD layer 116 is formed on the top surfaces of the first ILD layer 108 and the top electrode 114. Any suitable insulating material may be used for the material of the second ILD layer 116. As also shown in FIG. 13A, contact trenches are first formed in the second ILD layer 116 in areas corresponding to the top electrodes 114, and which expose the upper surfaces of the top electrodes 114. Then, first contacts 120 are formed in these trenches, as shown in FIG. 13A. The first contacts 120 may be, for example, a shared bit line (BL) contact, and may include any suitable conductive electrode material(s).

FIG. 13B is a cross-sectional view of the ReRAM device of FIG. 12B at a subsequent stage of the manufacturing process, taken along line B-B of FIG. 13C, according to embodiments. As shown in FIG. 13B, the first contact 120 is, for example, a shared bit line contact, which is shared between ReRAM memory device 100 cells 1-4 (on the left side of the device) and ReRAM memory device 100 cells 5-8 (on the right side of the device). Although FIG. 13B is shown with an example of eight total memory cells, it should be appreciated that any suitable greater or less total number of cells may be used. As also shown in FIG. 13B, second contacts 118 (e.g., word line (WL) contacts) are formed through the second ILD layer 116 and the first ILD layer 108 to make electrical contact with ReRAM device 100 cells 1-8. FIG. 13C is a top-down view of the ReRAM device of FIGS. 13A and 13B, according to embodiments, showing the approximate locations in plan view of the first contacts 120 and the second contacts 118.

Referring now to FIG. 14A, this figure is a cross-sectional view of a ReRAM device 200 at an intermediate stage of the manufacturing process, taken along line A-A of FIG. 14C, according to embodiments having a modified structure including an isolation slit (or layer) between right and left groups of memory cells. As shown in FIG. 14A a second ILD layer 216 is formed on the top surfaces of the first ILD layer 108 and the top electrode 214. Any suitable insulating material may be used for the material of the second ILD layer 216. As also shown in FIG. 14A, contact trenches are first formed in the second ILD layer 2116 in areas corresponding to the top electrodes 214, and which expose the upper surfaces of the top electrodes 214. Then, first contacts 220 are formed in these trenches, as shown in FIG. 14A. The first contacts 220 may be, for example, bit line (BL) contacts, and may include any suitable conductive electrode material(s).

FIG. 14B is a cross-sectional view of the ReRAM device 200 of FIG. 14A taken along line B-B of FIG. 14C, according to embodiments. As shown in FIG. 14B, the second set of contacts include first bit line contacts 220 and second bit line contacts 221. The first bit line contact 220 of the ReRAM memory device 200 functions to create memory cells with the first word line contacts 218 (or word lines) and cells 1-4 (on the left side of the device). Also, the first bit line contact 220 of the ReRAM memory device 200 functions to create memory cell with the first word line contacts 218 and cells (on the right side of the device). Moreover, an isolation slit in the form of more material of the first ILD layer 208 formed between right (cells 5-8) and left (cells 1-4) sides of the overall ReRAM memory device 200. Although FIG. 14B is shown with an example of eight total memory cells, it should be appreciated that any suitable greater or lesser total number of cells may be used. As also shown in FIG. 14B, the first word line contacts 218 (or word lines) are formed through the second ILD layer 216 and the first ILD layer 208 to make electrical contact with ReRAM device 200 cells 1-4.

FIG. 14C is a top-down view of the ReRAM device 200 of FIGS. 14A and 14B, according to embodiments, showing the approximate locations in plan view of the first bit line contacts 220, the second bit line contacts 221, the first word line contacts 218 and the second word line contacts 219. It should be appreciated that the word line contacts and bit line contacts may generically be considered as being electrical contacts.

As discussed above, an essential ReRAM mechanism is based on the formation and rupture of a nanoscale conducting filament typically formed between two electrodes that results in repeatable resistive switching between a high-resistance state and low-resistance state. A drawback of the ReRAM mechanism is that filament formation may require a high forming voltage if the ReRAM switch becomes very small. The present embodiments provide improved designs and techniques for formation of ReRAM devices by increasing the surface area between the ReRAM layers while minimizing (or not affecting) an increase in the overall footprint of the device.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A resistive random access memory (ReRAM) device comprising:
   a first electrode;
   a resistive switching element layer in contact with the first electrode; and
   a plurality of second electrodes in contact with the resistive switching element layer,
   wherein protruding portions of the first electrode and the resistive switching element layer overlap with the plurality of second electrodes in a vertical direction on a first side of the ReRAM device to form a plurality of vertically stacked ReRAM cells,
   wherein the plurality of ReRAM cells have a stepped configuration on a second side of the ReRAM device, and
   wherein a first contact is formed in contact with the first electrode and second contacts are formed in contact with each of the second electrodes for each of the respective ReRAM cells.

2. The ReRAM device of claim 1, wherein for each ReRAM cell, a portion of the second electrode that is not overlapped with the first electrode in the vertical direction is sandwiched between dielectric layers.

3. The ReRAM device of claim 2, wherein the dielectric layers have a higher etching selectivity relative to the second electrodes.

4. The ReRAM device of claim 2, wherein the dielectric layers are recessed in a lateral direction relative to the second electrodes.

5. The ReRAM device of claim 1, wherein the resistive switching layer includes a high-material.

6. The ReRAM device of claim 1, the first contact is a shared bit line that is in contact with the first electrode.

7. The ReRAM device of claim 1, wherein the second contacts are a plurality of word lines, each word line connected to one of the plurality of second electrodes.

8. The ReRAM device of claim 1, further comprising an interlayer dielectric layer separating a first group of the ReRAM cells from a second group of the ReRAM cells and dividing the first electrode into a first ReRAM cell group electrode and a second ReRAM cell group electrode.

9. The ReRAM device of claim 8, further comprising a plurality of first contacts that include a first bit line connected to the first ReRAM cell group electrode and a second bit line connected to the second ReRAM cell group electrode.

* * * * *